(12) United States Patent
Shibayama

(10) Patent No.: US 7,768,086 B2
(45) Date of Patent: Aug. 3, 2010

(54) BACKSIDE-ILLUMINATED PHOTODETECTOR

(75) Inventor: Katsumi Shibayama, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 240 days.

(21) Appl. No.: 10/565,945

(22) PCT Filed: Jul. 22, 2004

(86) PCT No.: PCT/JP2004/010411

§ 371 (c)(1),
(2), (4) Date: Apr. 17, 2006

(87) PCT Pub. No.: WO2005/011004

PCT Pub. Date: Feb. 3, 2005

(65) Prior Publication Data

US 2008/0073740 A1     Mar. 27, 2008

(30) Foreign Application Priority Data

Jul. 29, 2003   (JP) .............................. 2003-282162

(51) Int. Cl.
*H01L 31/0203* (2006.01)
(52) U.S. Cl. ........................ 257/434; 257/431; 257/437; 257/E27.133; 257/E31.118
(58) Field of Classification Search ................. 257/434, 257/228, 85, E21, 431, 437, E27.133, E31.118; 438/26, 48
See application file for complete search history.

(56) References Cited

U.S. PATENT DOCUMENTS 5,098,630 A * 3/1992 Ogiu et al. ............. 264/272.15
5,691,548 A * 11/1997 Akio ........................... 257/232
2003/0218120 A1* 11/2003 Shibayama ............... 250/214.1
2005/0265217 A1* 12/2005 Ootera ....................... 369/283

FOREIGN PATENT DOCUMENTS

| DE | 41 02 285 | 8/1992 |
| EP | 0 279 492 | 8/1988 |
| EP | 0 444 370 | 9/1991 |
| EP | 0 697 743 | 2/1996 |
| EP | 1 548 836 | 6/2005 |

(Continued)

*Primary Examiner*—Cuong Q Nguyen
*Assistant Examiner*—Cathy N Lam
(74) *Attorney, Agent, or Firm*—Drinker, Biddle & Reath LLP

(57) ABSTRACT

The present invention is directed to provide a back illuminated photodetector having a sufficiently small package as well as being capable of suppressing the scattering of to-be-detected light. A back illuminated photodiode 1 comprises an N-type semiconductor substrate 10, a P+-type impurity semiconductor region 11, a recessed portion 12, a coating layer 13, and a window plate 14. In the surface layer on the upper surface S1 side of the N-type semiconductor substrate 10 is formed the P+-type impurity semiconductor region 11. In the rear surface S2 of the N-type semiconductor substrate 10 and in an area opposite the P+-type impurity semiconductor region 11 is formed the recessed portion 12 that functions as an incident part for to-be-detected light. Also, the coating layer 13 having a substantially flat surface is provided on the rear surface S2 of the N-type semiconductor substrate 10. Further, the window plate 14 is provided on the coating layer 13.

7 Claims, 32 Drawing Sheets

FOREIGN PATENT DOCUMENTS

| | | |
|---|---|---|
| EP | 1 648 036 | 4/2006 |
| JP | 2-185070 | 7/1990 |
| JP | 05-135261 | 6/1993 |
| JP | 5-136261 | 6/1993 |
| JP | 8-111542 | 4/1996 |
| JP | 8-293476 | 11/1996 |
| JP | 09-219421 | 8/1997 |
| JP | 10-223873 | 8/1998 |
| JP | 2000-502215 | 2/2000 |
| JP | 2000-299489 | 10/2000 |
| JP | 2002-319669 | 10/2002 |
| WO | 96/36999 | 5/1996 |
| WO | 97/23897 | 12/1996 |
| WO | 2004/019411 | 3/2004 |
| WO | 2005/008788 | 1/2005 |

* cited by examiner

BACKSIDE-ILLUMINATED PHOTODETECTOR

TECHNICAL FIELD

The present invention relates to a back illuminated photodetector.

BACKGROUND ART

In such a conventional back illuminated photodiode 100 as shown in FIG. 32, in the superficial surface layer of an N-type silicon substrate 101 are formed a $P^+$-type highly-doped impurity semiconductor region 102 and an $N^+$-type highly-doped impurity semiconductor region 103. The $P^+$-type highly-doped impurity semiconductor region 102 and the $N^+$-type highly-doped impurity semiconductor region 103 are connected, respectively, with an anode electrode 104 and a cathode electrode 105. On the electrodes 104 and 105 are formed bump electrodes 106 made from solder. Also, the N-type silicon substrate 101 is thinned in the portion corresponding to the $P^+$-type highly-doped impurity semiconductor region 102 from the rear surface side thereof. The thinned portion functions as an incident part for to-be-detected light.

As shown in FIG. 32, the back illuminated photodiode 100 is packed into a ceramic package 107 by flip-chip bonding. That is, the bump electrodes 106 of the back illuminated photodiode 100 are connected to solder pads 109 provided on a bottom wiring 108 of the ceramic package 107. The bottom wiring 108 is electrically connected to output terminal pins 110 through wire bonding. Also, on the upper surface of the ceramic package 107 is seam-welded a window frame 111 using brazing material 112. In the window frame 111 is formed an opening at the position corresponding to the thinned portion of the back illuminated photodiode 100, and in the opening is provided a transparet window member 113 such as kovar glass for transmitting to-be-detected light.

Patent Document 1: Japanese Published Unexamined Patent Application No. H09-219421

DISCLOSURE OF THE INVENTION

Problems to be Solved by the Invention

In such an arrangement of using a ceramic package in a back illuminated photodiode as above, there is a problem in that the package becomes larger.

Meanwhile, in Patent Document 1 is disclosed a CSP (Chip Size Package) technique for semiconductor electronic components. This technique is adapted to seal the both surfaces of a wafer with semiconductor electronic components built therein using organic material such as resin, and then to form an opening in the organic material provided on one surface side of the wafer by photolithography to form electrodes therein.

However, trying to apply such a CSP technique to a back illuminated photodiode to reduce the package size leads to the following problem. In the case of a back illuminated photodiode with the rear surface being sealed with resin, the resin surface functions as an incident plane for to-be-detected light. However, it may be difficult to flatten the resin surface sufficiently on the order of the wavelength of the to-be-detected light. Unless the resin surface is flattened sufficiently, the incident plane for to-be-detected light remains rough, resulting accordingly in a problem in that the to-be-detected light may be scattered at the incident plane.

The present invention has been made to solve the above-described problems, and an object thereof is to provide a back illuminated photodetector having a sufficiently small package as well as being capable of suppressing the scattering of to-be-detected light and method for manufacturing the same.

Means for Solving the Problem

In order to solve the above-described problem, the present invention is directed to a back illuminated photodetector comprising: a first conductive type semiconductor substrate; a second conductive type impurity semiconductor region provided in the first superficial surface layer of the semiconductor substrate; a recessed portion for incidence of to-be-detected light formed in the second surface of the semiconductor substrate and in an area opposite the impurity semiconductor region; a coating layer made of resin for transmitting the to-be-detected light to the recessed portion and having a substantially flat surface, the coating layer being provided on the second surface; and a window plate provided on the surface of the coating layer to transmit the to-be-detected light to the coating layer.

In the back illuminated photodetector, since there is provided the coating layer, the mechanical strength of the back illuminated photodetector can be increased. The increase in mechanical strength allows for dicing per whole wafer, whereby it is possible to obtain a chip-sized back illuminated photodetector. Accordingly, it is possible to achieve a back illuminated photodetector having a sufficiently small package. The coating layer is also made of resin for transmitting to-be-detected light not only to increase the mechanical strength of the back illuminated photodetector, but also to function as a transparent window member for to-be-detected light.

Further, the window plate is provided on the surface of the coating layer. Therefore, the surface of the window plate functions as an incident plane for to-be-detected light, whereby it is possible to suppress the scattering of to-be-detected light at the incident plane. In addition, when providing the window plate, the surface of the coating layer is pressed against the window plate, whereby the interface between the window plate and the coating layer, that is, the surface of the coating layer is to be flattened sufficiently. It is therefore possible to suppress the scattering of to-be-detected light at the surface of the coating layer. Accordingly, it is possible to achieve a highly sensitive back illuminated photodetector. Also, the window plate further increases the mechanical strength of the back illuminated photodetector.

It is preferable that the coating layer consists of a first resin layer provided on the second surface and a second resin layer provided on said first resin layer and having a substantially flat surface on the opposite side of said first resin layer, and wherein said first resin layer is arranged in such a manner that the portion provided on said recessed portion in the second surface is sunk lower than the portion provided on the outer edge portion of said recessed portion. In this case, even if a flat collet may be used in the manufacturing process, it is ensured that the back illuminated photodetector detects light at a high sensitivity.

The back illuminated photodetector according to the present invention preferably comprises a supporting film provided on the first surface of the semiconductor substrate to support the semiconductor substrate. In this case, the mechanical strength of the back illuminated photodetector can be increased.

The back illuminated photodetector according to the present invention, further comprising a supporting film provided on the first surface of the semiconductor substrate to support the semiconductor substrate. In this case, it is possible to take a detected signal easily outside the back illuminated photodetector.

It is preferable that the window plate has a square cross-sectional shape with at least one corner being chamfered in a plane perpendicular to the thickness direction thereof. In this case, it is possible to prevent chipping on dicing the back illuminated photodetector.

It is preferable that a highly-doped impurity semiconductor region with impurities of said first conductive type added thereto at a high concentration is exposed across the entire side surface of said semiconductor substrate. In this case, even if a side surface of the semiconductor substrate may be damaged through dicing, etc., the highly-doped impurity semiconductor region can trap unnecessary carriers that are generated in the vicinity of the side surface of the semiconductor substrate, and therefore can suppress dark current and/or noise.

It is preferable that a highly-doped impurity semiconductor layer with impurities of the first conductive type added thereto at a high concentration is provided in the bottom portion of the recessed portion within the second superficial surface layer of the semiconductor substrate. The highly-doped impurity semiconductor layer functions as an accumulation layer. This can prevent carriers generated upon incidence of to-be-detected light from being recombined in the vicinity of the bottom surface of the recessed portion, and therefore make the carriers easy to move toward the second conductive type impurity semiconductor region provided in the first superficial surface layer of the semiconductor substrate, resulting in an increase in sensitivity.

It is preferable that a highly-doped impurity semiconductor layer with impurities of said first conductive type added thereto at a high concentration is provided in the second superficial surface layer in the outer edge portion of said semiconductor substrate. In this case, even if there may be crystal defects in the vicinity of the second superficial surface in the outer edge portion, the highly-doped impurity semiconductor layer can suppress dark current and/or noise due to the crystal defects.

Effects of the Invention

In accordance with the present invention, it is possible to achieve a back illuminated photodetector having a sufficiently small package as well as being capable of suppressing the scattering of to-be-detected light.

DESCRIPTION OF SYMBOLS

Figure 1:
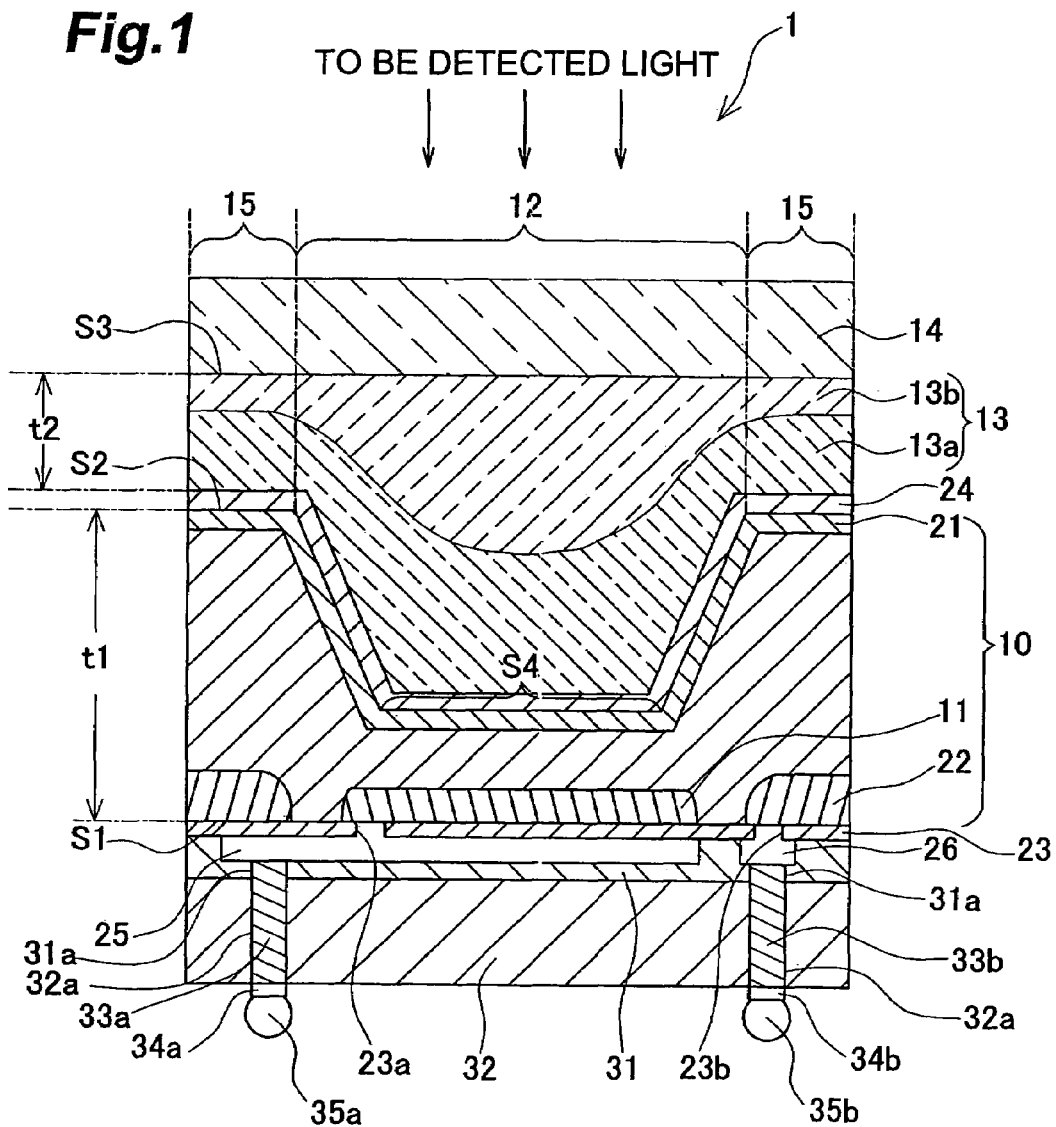
FIG. 1 is a cross-sectional view showing a first embodiment of a back illuminated photodetector according to the present invention.

1; 1a; 2; 3 and 4: Back illuminated photodiodes, 5: Back illuminated photodiode array, 10; 20 and 50: N-type semiconductor substrates, 11 and 51: P$^+$-type impurity semiconductor regions, 12 and 52: Recessed portions, 13; 16 and 53:

Coating layers, 13a; 13b; 53a and 53b: Resin layers, 14 and 54: Window plates, 14a: Chamfered portion, 14b: Hole portion, 15 and 55: Outer edge portions, 21 and 61: $N^+$-type highly-doped impurity semiconductor layers, 22; 28 and 62: $N^+$-type highly-doped impurity semiconductor regions, 23; 24; 63 and 64: Insulating films, 25 and 65: Anode electrodes, 26 and 66: Cathode electrodes, 31 and 71: Passivating films, 32 and 72: Supporting films, 33a; 33b; 73a and 73b: Filling electrodes, 34a; 34b; 74a and 74b: UBMs, 35a; 35b; 75a and 75b: Bumps, S1: Upper surface, S2: Rear surface, S3: Surface of the coating layer 13, S4: Bottom surface of recessed portion, S5: Side surface of the N-type semiconductor substrate 20

BEST MODES FOR CARRYING OUT THE INVENTION

Preferred embodiments of a back illuminated photodetector according to the present invention will hereinafter be described in detail with reference to the accompanying drawings. Additionally, in the descriptions of the drawings, identical components are designated by the same reference numerals to omit redundant description. Also, the dimensional ratios in the drawings do not necessarily correspond to those in the descriptions.

FIG. 1 is a cross-sectional view showing a first embodiment of a back illuminated photodetector according to the present invention. The back illuminated photodiode 1 is adapted to receive to-be-detected light from the rear surface thereof, to generate carriers upon incidence of the to-be-detected light, and then to output the generated carriers as a detected signal from the upper surface thereof. The back illuminated photodiode 1 comprises an N-type semiconductor substrate 10, a $P^+$-type impurity semiconductor region 11, a recessed portion 12, a coating layer 13, and a window plate 14. As the N-type semiconductor substrate 10, for example, a silicon substrate with N-type impurities such as phosphorous added thereto can be used. The impurity concentration of the N-type semiconductor substrate 10 is $10^{12}$ to $10^{15}$/cm$^3$, for example. Also, the thickness t1 of the N-type semiconductor substrate 10 is 200 to 500 μm, for example.

In the surface layer on the upper surface (first surface) S1 side of the N-type semiconductor substrate 10 is partially formed the $P^+$-type impurity semiconductor region 11. The $P^+$-type impurity semiconductor region 11 is provided with P-type impurities such as boron to form a PN junction with the N-type semiconductor substrate 10. The impurity concentration of the $P^+$-type impurity semiconductor region 11 is $10^{15}$ to $10^{20}$/cm$^3$, for example. Also, the depth of the $P^+$-type impurity semiconductor region 11 is 0.1 to 20 μm, for example.

In the rear surface (second surface) S2 of the N-type semiconductor substrate 10 and in an area opposite the $P^+$-type impurity semiconductor region 11 is formed the recessed portion 12. The recessed portion 12 functions as an incident part for to-be-detected light. The recessed portion 12 has a shape that narrows gradually from the rear surface S2 to the upper surface S1. More specifically, the recessed portion 12 may have, for example, a square pyramid shape or a tapered shape that narrows gradually from the rear surface S2 to the upper surface S1. The depth of the recessed portion 12 is 2 to 400 μm, for example. Also, due to the thus formed recessed portion 12, the area between the bottom surface S4 of the recessed portion and the $P^+$-type impurity semiconductor region 11 within the N-type semiconductor substrate 10 is made thinner than the other areas so that carriers generated upon incidence of to-be-detected light via the rear surface S2 can easily reach near the $P^+$-type impurity semiconductor region 11 provided in the surface layer on the upper surface S1 side. In addition, the thickness of the thinned area is 10 to 200 μm, for example.

On the rear surface S2 of the N-type semiconductor substrate 10 is provided the coating layer 13. The coating layer 13 fills the space between the N-type semiconductor substrate 10 and the window plate 14 to be described hereinafter, and connects the N-type semiconductor substrate 10 and the window plate 14 optically with each other. The coating layer 13 connects the N-type semiconductor substrate 10 and the window plate 14 also physically with each other. The coating layer 13 consists of a resin layer 13a (first resin layer) provided on the rear surface S2 and a resin layer 13b (second resin layer) provided on the resin layer 13a. As the resin layers 13a and 13b, resin transparent to to-be-detected light is used, that is, having a sufficient transparency for the wavelength of to-be-detected light. As such a resin epoxy-based, silicon-based, acryl-based or polyimide-based one, or composite material thereof can be cited. Also, the resin preferably has adhesion properties. In this case, since the N-type semiconductor substrate 10 and the window plate 14 can be bonded solidly to each other, it is possible to further increase the physical strength thereof. The resin layers 13a and 13b may use identical resins or different resins. In the case of using different resins, the resins preferably have much the same refractive index. The coating layer 13 functions as a protective layer for protecting the rear surface S2 as well as a transparent window member for transmitting to-be-detected light to the recessed portion 12.

The resin layer 13a is arranged in such a manner that the portion provided on the recessed portion 12 is sunk lower than the portion provided on the outer edge portion 15 of the recessed portion 12. That is, the surface of the resin layer 13a provided in the portion where the recessed portion 12 is formed gets into the N-type semiconductor substrate 10 side deeper than the surface of the resin layer 13a provided in the outer edge portion 15 of the recessed portion 12. The resin layer 13b is brought into close contact with the resin layer 13a with no clearance, and therefore has a shape having a protrusion on the resin layer 13a side which corresponds to the recession of the resin layer 13a. Meanwhile, the surface S3 (surface on the opposite side of the resin layer 13a) of the resin layer 13b has a substantially flat shape. It is noted that the outer edge portion 15 indicates the portion laterally surrounding the recessed portion 12 within the N-type semiconductor substrate 10. The thickness t2 of the coating layer 13 is 1 to 200 μm, for example, and preferably approximately 30 μm with reference to the outer edge portion 15.

On the surface of the coating layer 13, that is, on the surface S3 of the resin layer 13b is provided the window plate 14. The window plate 14 is brought into close contact with the coating layer 13 with no clearance. The window plate 14 has a flat plate shape and is made of a material that has a sufficient transparency for the wavelength of to-be-detected light. As a material of the window plate 14, glass or optical crystal can be used. As a material of the window plate 14, quartz, sapphire, covar glass, etc., can specifically be cited. Also, the thickness of the window plate 14 is 0.2 to 1 mm, for example. It is noted that the window plate 14 may be coated with AR (Anti Reflection) coating.

The back illuminated photodiode 1 also comprises an $N^+$-type highly-doped impurity semiconductor layer 21, an $N^+$-type highly-doped impurity semiconductor region 22, insulating films 23 and 24, an anode electrode 25, and a cathode electrode 26. The $N^+$-type highly-doped impurity semiconductor layer 21 is formed in the entire surface layer on the rear surface S2 side of the N-type semiconductor substrate 10. The N$^+$-type highly-doped impurity semiconductor layer 21 is provided with N-type impurities at a concentration higher than in the N-type semiconductor substrate 10. The impurity concentration of the N$^+$-type highly-doped impurity semiconductor layer 21 is $10^{15}$ to $10^{20}$/cm$^3$, for example. Also, the depth of the N$^+$-type highly-doped impurity semiconductor layer 21 is 0.1 to 20 μm, for example.

The N$^+$-type highly-doped impurity semiconductor region 22 is formed in the surface layer on the upper surface S1 side of the N-type semiconductor substrate 10 at a predetermined distance from the P$^+$-type impurity semiconductor region 11. The N$^+$-type highly-doped impurity semiconductor region 22 is also provided with N-type impurities at a high concentration, as is the case with the N$^+$-type highly-doped impurity semiconductor layer 21, to be a contact layer for the cathode electrode 26 to be described hereinafter. The impurity concentration of the N$^+$-type highly-doped impurity semiconductor region 22 is $10^{15}$ to $10^{20}$/cm$^3$, for example. Also, the depth of the N$^+$-type highly-doped impurity semiconductor region 22 is 0.1 to 30 μm, for example.

The insulating films 23 and 24 are formed, respectively, on the upper surface S1 and the rear surface S2 of the N-type semiconductor substrate 10. The insulating films 23 and 24 are made of SiO$_2$, for example. The thickness of the insulating film 23 is 0.1 to 2 μm, for example. Meanwhile, the thickness of the insulating film 24 is 0.05 to 1 μm, for example. Also, in the insulating film 23 are formed openings (contact holes) 23a and 23b, one opening 23a being provided within the range of the P$^+$-type impurity semiconductor region 11, while the other opening 23b being provided within the range of the N$^+$-type highly-doped impurity semiconductor region 22.

On the insulating film 23 and in the areas including the openings 23a and 23b are formed, respectively, the anode electrode 25 and the cathode electrode 26. The thickness of the electrodes 25 and 26 is 1 μm, for example. The electrodes 25 and 26 are provided in such a manner as to fill the respective openings 23a and 23b. Thus, the anode electrode 25 is connected directly to the P$^+$-type impurity semiconductor region 11 through the opening 23a, while the cathode electrode 26 is connected directly to the N$^+$-type highly-doped impurity semiconductor region 22 through the opening 23b. As the anode and cathode electrodes 25 and 26, for example, Al, can be used.

The back illuminated photodiode 1 further comprises a passivating film 31, a supporting film 32, filling electrodes 33a and 33b, UBMs (Under Bump Metals) 34a and 34b, and bumps 35a and 35b. The passivating film 31 is provided on the upper surface S1 of the N-type semiconductor substrate 10 in such a manner as to cover the insulating film 23, anode electrode 25, and cathode electrode 26. Also, in the portions provided on the anode electrode 25 and the cathode electrode 26 within the passivating film 31 are formed through holes 31a to be filled with the filling electrodes 33a and 33b to be described hereinafter. The passivating film 31 is made of SiN, for example, to protect the upper surface S1 of the N-type semiconductor substrate 10. The passivating film 31 can be formed by, for example, a plasma-CVD method. Also, the thickness of the passivating film 31 is 1 μm, for example.

On the passivating film 31 is formed the supporting film 32. The supporting film 32 is adapted to support the N-type semiconductor substrate 10. Also, in the portions corresponding to the through holes 31a in the passivating film 31 within the supporting film 32 are formed through holes 32a to be filled with the filling electrodes 33a and 33b that also fill the through holes 31a. As a material of the supporting film 32, for example, resin or SiO$_2$, etc., that can be formed by, for example, a plasma-CVD method can be used. Also, the thickness of the supporting film 32 is 2 to 100 μm, for example, and preferably about 50 μm.

The filling electrodes 33a and 33b fill the through holes 31a and 32a, and are brought into contact, respectively, with the anode electrode 25 and the cathode electrode 26 at one end thereof to be connected electrically to the P$^+$-type impurity semiconductor region 11 and the N$^+$-type highly-doped impurity semiconductor region 22. Also, the other end of the filling electrodes 33a and 33b is exposed at the surface of the supporting film 32. That is, the filling electrodes 33a and 33b penetrate through the passivating film 31 and the supporting film 32 to extend, respectively, from the anode electrode 25 and the cathode electrode 26 to the surface of the supporting film 32. In addition, the filling electrodes 33a and 33b each have an approximately cylindrical shape. The filling electrodes 33a and 33b are adapted to connect, respectively, the electrodes 25 and 26 and the bumps 35a and 35b to be described hereinafter electrically with each other. The filling electrodes 33a and 33b are made of Cu, for example. Also, the diameter of the through holes 31a and 32a is 10 to 200 μm, for example, and preferably about 100 μm.

On the exposed portions of the filling electrodes 33a and 33b at the surface of the supporting film 32 are formed the UBMs 34a and 34b. The UBMs 34a and 34b are composed of laminated films made of Ni and Au, for example. Also, the thickness of the UBMs 34a and 34b is 0.1 to 5 μm, for example.

On the surfaces of the UBMs 34a and 34b on the opposite side of the filling electrodes 33a and 33b are formed the bumps 35a and 35b. The bumps 35a and 35b are therefore connected, respectively, to the anode electrode 25 and the cathode electrode 26 electrically. The bumps 35a and 35b each have an approximately spherical shape except for the surfaces in contact with the UBMs 34a and 34b. As the bumps 35a and 35b, for example, solder, gold, Ni—Au, Cu, or resin containing metal filler can be used.

Figure 2:
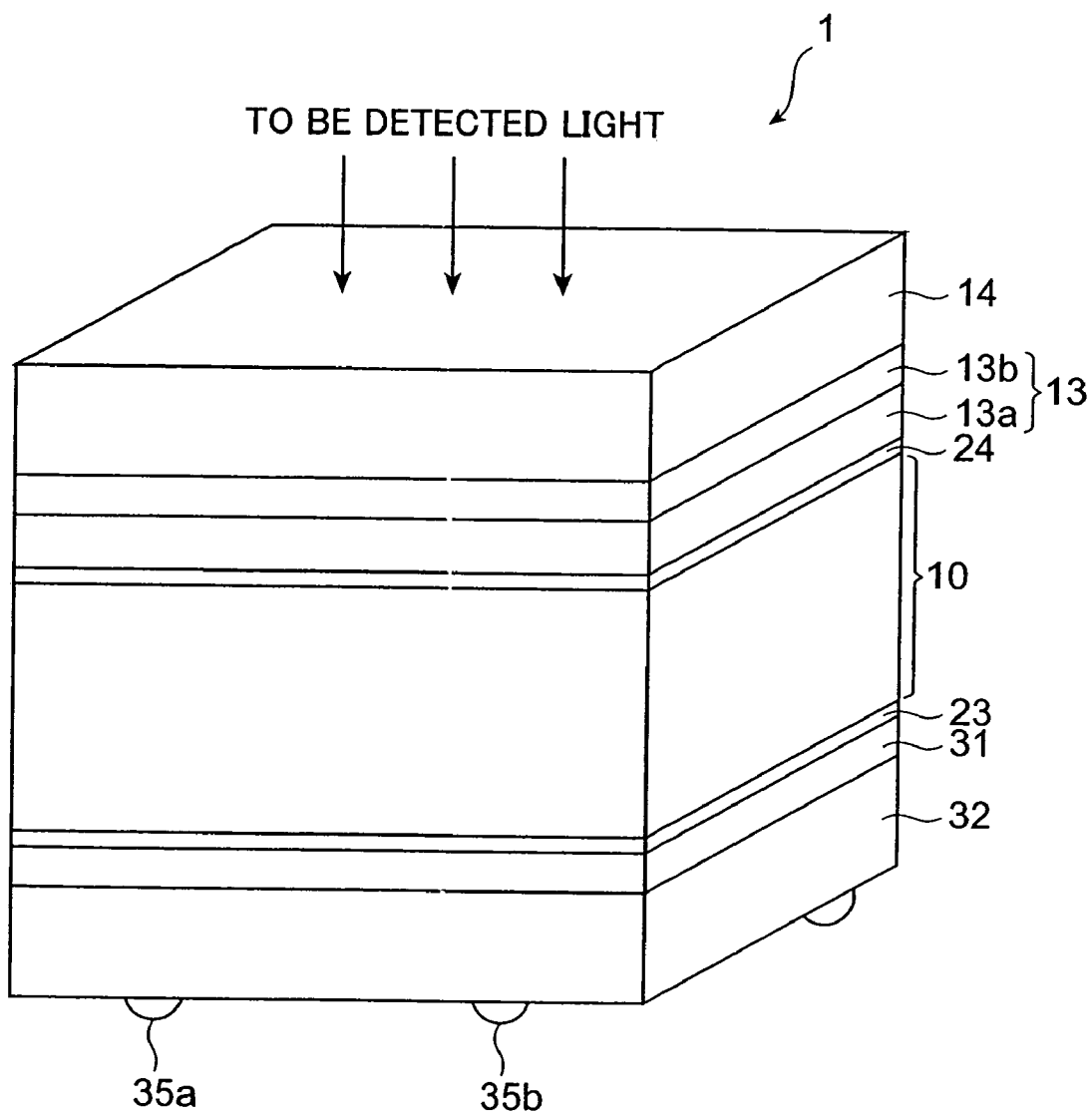
FIG. 2 is a perspective view of the back illuminated photodiode 1 shown in FIG. 1.

FIG. 2 is a perspective view of the thus arranged back illuminated photodiode 1. As can be seen from this figure, the back illuminated photodiode 1 is obtained through dicing to be an approximately rectangular solid overall shape excluding the UBMs 34a and 34b and the bumps 35a and 35b. Additionally, the N$^+$-type highly-doped impurity semiconductor layer 21 and the N$^+$-type highly-doped impurity semiconductor region 22 exposed at the side surfaces of the N-type semiconductor substrate 10 are omitted in FIG. 2.

The operation of the back illuminated photodiode 1 will here be described. It is assumed here that the back illuminated photodiode 1 is applied with a reverse bias voltage, and that there is generated a depletion layer in the thinned area in the N-type semiconductor substrate 10. When to-be-detected light penetrates through the window plate 14 and the coating layer 13 in this order, and then enters the N-type semiconductor substrate 10 from the recessed portion 12, the light is absorbed mainly in the thinned area to generate carriers (holes and electrons) in the area. The generated holes and electrons are moved, respectively, to the P$^+$-type impurity semiconductor region 11 and the N$^+$-type highly-doped impurity semiconductor region 22 in accordance with the reverse bias electric field. Holes and electrons that have reached the P$^+$-type impurity semiconductor region 11 and the N$^+$-type highly-doped impurity semiconductor region 22 are moved to the bumps 35a and 35b from the filling electrodes 33a and 33b and the UBMs 34a and 34b to be output as a detected signal from the bumps 35a and 35b.

The effect of the back illuminated photodiode 1 will here be described. In the back illuminated photodiode 1, since there is provided the coating layer 13, the mechanical strength of the back illuminated photodiode 1 is increased. In particular, since the coating layer 13 is provided on the recessed portion 12, it is possible to prevent the thinned area in the N-type semiconductor substrate 10 from being distorted, flexed or damaged even if pressure and/or heat may be applied to the back illuminated photodiode 1 in an assembling operation. Also, the increase in mechanical strength allows for dicing per whole wafer, whereby it is possible to obtain a chip-sized back illuminated photodiode 1. Accordingly, there is achieved a back illuminated photodiode 1 having a sufficiently small package. In addition, since there is no need for a ceramic package, etc., it is possible to reduce the cost of manufacturing a back illuminated photodiode 1. There is thus achieved an inexpensive and highly reliable as well as a small back illuminated photodiode 1.

Further, the window plate 14 is provided on the surface S3 of the coating layer 13. Therefore, the surface of the window plate 14 functions as an incident plane for to-be-detected light, whereby it is possible to suppress the scattering of to-be-detected light at the incident plane. In addition, when providing the window plate 14, the surface S3 of the coating layer 13 is pressed against the window plate 14, whereby the interface between the window plate 14 and the coating layer 13, that is, the surface S3 of the coating layer 13 is to be flattened sufficiently. It is therefore possible to suppress the scattering of to-be-detected light at the surface S3 of the coating layer 13. Accordingly, it is possible to achieve a highly sensitive back illuminated photodiode 1. Also, the window plate 14 further increases the mechanical strength of the back illuminated photodiode 1. It is noted that "the surface S3 is flat" means that the surface S3 is smooth on the order of the wavelength of the to-be-detected light. Therefore, the surface S3 of the coating layer 13 is not restricted to have a planar shape, but may have a curved shape.

In addition, since the surface S3 of the coating layer 13 has a substantially flat shape, it is possible to suppress the increase in transmission loss of to-be-detected light entering the recessed portion 12. If the coating layer 13 consists only of the resin layer 13a, there will be generated an airspace between the resin layer 13a and the window plate 14 correspondingly to the recession of the resin layer 13a. Thus, the resin layer 13a functions as a concave lens, resulting in a possibility of diffusing to-be-detected light. Such a diffusion, which reduces the intensity of the to-be-detected light entering the recessed portion 12, unpreferably leads to a reduction of the sensitivity in the back illuminated photodiode 1.

On the contrary, in the back illuminated photodiode 1, the resin layer 13b is provided on the resin layer 13a to flatten the surface S3 of the coating layer 13 substantially. Thus, in the back illuminated photodiode 1, since there will be generated no airspace between the coating layer 13 and the window plate 14, it is ensured that the back illuminated photodiode 1 detects light at a high sensitivity.

In addition, providing the coating layer 13 also on the outer edge portion 15 prevents the flat collet from being brought into direct contact with the outer edge portion 15. It is thus possible to prevent the generation of crystal defects in the outer edge portion 15 due to contact with the flat collet, and therefore to suppress dark current and/or noise due to the crystal defects.

Also, as the coating layer 13 resin is used, which makes it easy to form the coating layer 13 into a desired shape.

Figure 3:
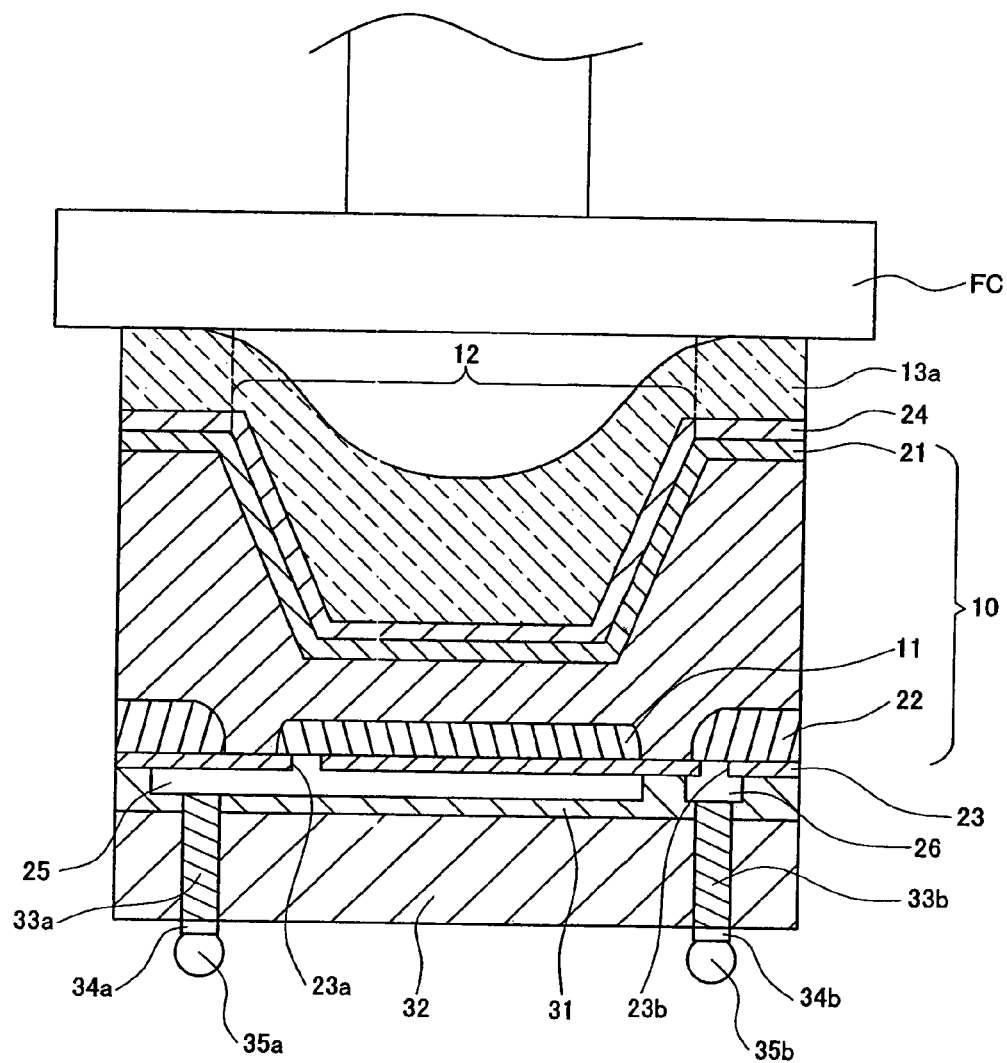
FIG. 3 is a view illustrating the effect of the back illuminated photodiode 1 shown in FIG. 1.
Figure 4:
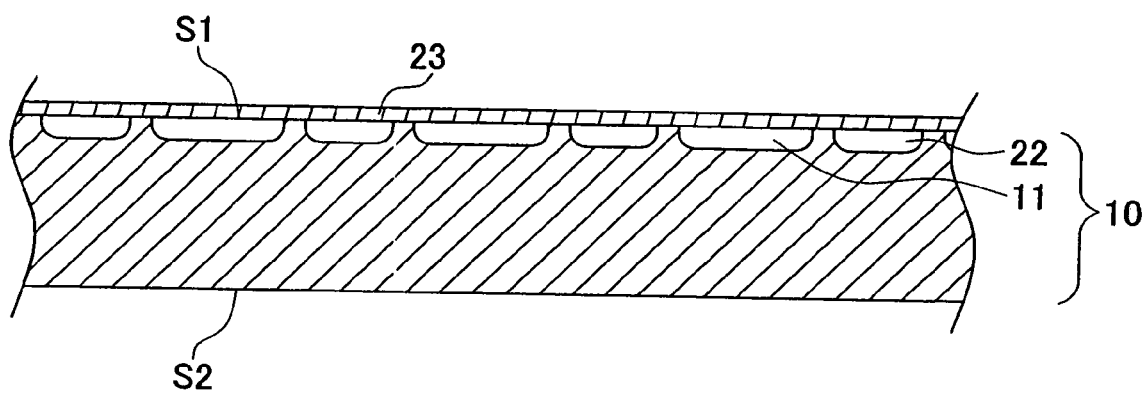
FIG. 4 is a step chart showing a method of manufacturing the back illuminated photodiode 1 shown in FIG. 1.

The arrangement that the coating layer 13 consists of two layers, i.e., the resin layers 13a and 13b provides an opportunity to use a flat collet suitably in the manufacturing process while ensuring that the back illuminated photodiode 1 detects light at a high sensitivity. That is, in the case of requiring that a flat collet is used before the window plate 14 is provided, if the resin layers 13a and 13b have been both provided, there is a possibility that the surface S3 of the resin layer 13b may be damaged due to contact with the flat collet as mentioned above. Meanwhile, if the resin layers 13a and 13b have not been provided, there may be crystal defects in the outer edge portion 15 due to contact with the flat collet as mentioned above. The crystal defects lead to an increase in dark current and/or noise. On the contrary, if the coating layer 13 consists of two layers, i.e., resin layers 13a and 13b, it is possible to use a flat collet with only the resin layer 13a of the resin layers 13a and 13b being provided. Then, since the resin layer 13a is arranged in such a manner that the portion provided on the recessed portion 12 is sunk, the surface of the resin layer 13a provided on the recessed portion 12 is not brought into contact with the flat collet FC as shown in FIG. 3. Thus, the portion through which to-be-detected light transmits within the surface of the resin layer 13a cannot be damaged. Therefore, even if a flat collet may be used in the manufacturing process, it is ensured that the back illuminated photodiode 1 detects light at a high sensitivity.

Further, the resin layer 13b can function as an adhesive material on providing the window plate 14 on the surface S3 of the coating layer 13.

The provided supporting film 32 further increases the mechanical strength of the back illuminated photodiode 1.

The provided filling electrodes 33a and 33b make it easy to take a detected signal outside from the electrodes 25 and 26. Additionally, the filling electrodes 33a and 33b may be formed on the sidewalls of the through holes 31a and 32a to be connected electrically to the anode electrode 25 and the cathode electrode 26.

The $N^+$-type highly-doped impurity semiconductor layer 21 is formed in the entire surface layer on the rear surface S2 side of the N-type semiconductor substrate 10. The $N^+$-type highly-doped impurity semiconductor layer 21 provided in the bottom surface S4 portion of the recessed portion 12 within the surface layer of the rear surface S2 functions as an accumulation layer. It is thus possible to guide carriers generated in the N-type semiconductor substrate 10 effectively to the PN junction on the upper surface S1 side by the electric field distribution in the layer. There is thus achieved a more highly sensitive back illuminated photodiode 1. Here, the impurity concentration of the $N^+$-type highly-doped impurity semiconductor layer 21 is preferably $10^{15}/cm^3$ or more. In this case, the $N^+$-type highly-doped impurity semiconductor layer 21 can suitably function as an accumulation layer.

Also, even if there may be crystal defects in the outer edge portion 15, the $N^+$-type highly-doped impurity semiconductor layer 21, which is provided in the surface layer on the rear surface S2 side within the outer edge portion 15 of the N-type semiconductor substrate 10, can suppress dark current and/or noise due to the crystal defects. Therefore, in accordance with the back illuminated photodiode 1, it is possible to obtain a detected signal at a high S/N ratio. Also, here, the impurity concentration of the $N^+$-type highly-doped impurity semiconductor layer 21 is preferably $10^{15}/cm^3$ or more. In this case, the $N^+$-type highly-doped impurity semiconductor layer 21 can suppress dark current and/or noise due to crystal defects sufficiently.

An exemplary method for manufacturing the back illuminated photodiode 1 shown in FIG. 1 will here be described with reference to FIG. 4 to FIG. 20. First, there is prepared an N-type semiconductor substrate 10 made of an N-type silicon wafer with the upper surface S1 and the rear surface S2 thereof being formed into (100) planes. The N-type semiconductor substrate 10 is thermally oxidized to form an insulating film made of $SiO_2$ on the upper surface S1 of the N-type semiconductor substrate 10. Also, in predetermined portions of the insulating film are formed openings, and then phosphorous is doped into the N-type semiconductor substrate 10 through the openings to form $N^+$-type highly-doped impurity semiconductor regions 22. Subsequently, the N-type semiconductor substrate 10 is oxidized to form an insulating film on the upper surface S1. Similarly, in predetermined portions of the insulating film are formed openings, and then boron is doped into the N-type semiconductor substrate 10 through the openings to form $P^+$-type impurity semiconductor regions 11 (impurity semiconductor region forming step). Subsequently, the N-type semiconductor substrate 10 is oxidized to form an insulating film 23 on the upper surface S1 (FIG. 3).

Figure 5:
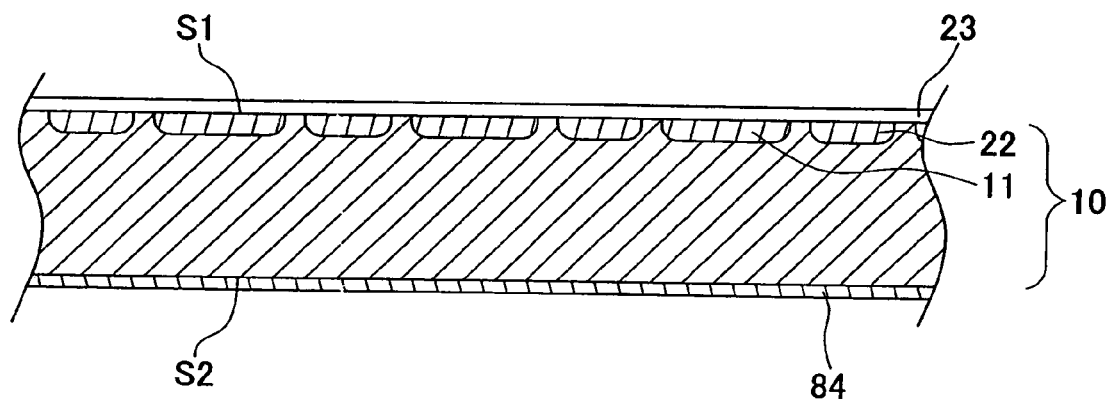
FIG. 5 is a step chart showing a method of manufacturing the back illuminated photodiode 1 shown in FIG. 1.
Figure 6:
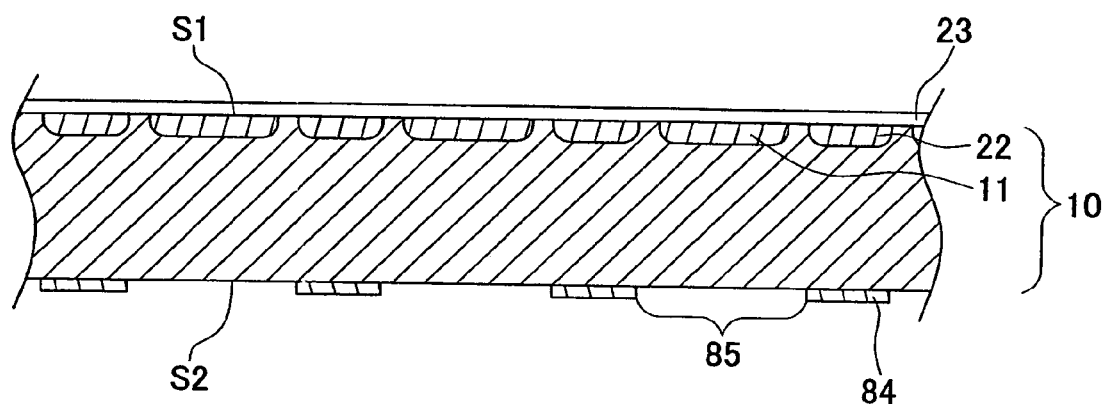
FIG. 6 is a step chart showing a method of manufacturing the back illuminated photodiode 1 shown in FIG. 1.
Figure 7:
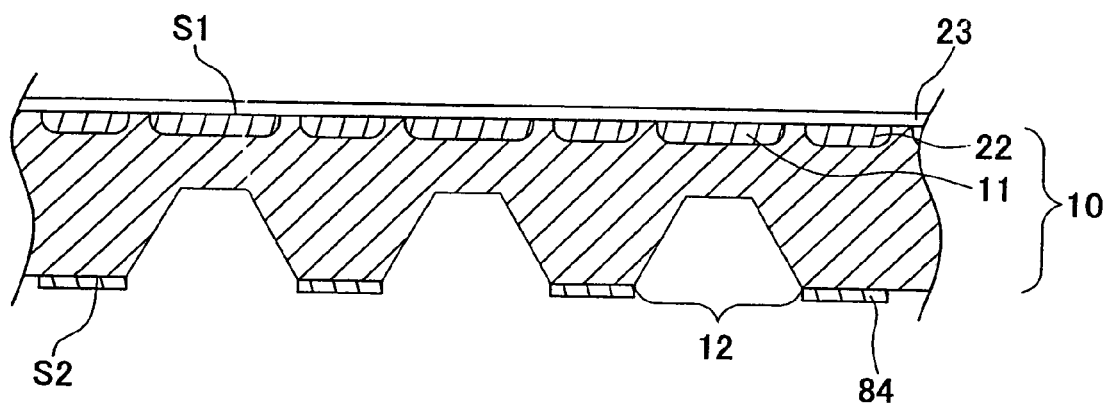
FIG. 7 is a step chart showing a method of manufacturing the back illuminated photodiode 1 shown in FIG. 1.

Next, the rear surface S2 of the N-type semiconductor substrate 10 is polished, and then SiN 84 is deposited on the rear surface S2 of the N-type semiconductor substrate 10 by LP-CVD (FIG. 5). Also, in the SiN 84 on the rear surface S2 are formed openings 85 to form recessed portions 12 (FIG. 6). Then, an etching operation is performed using KOH, etc., through the openings 85 to form recessed portions 12 (FIG. 7).

Figure 8:
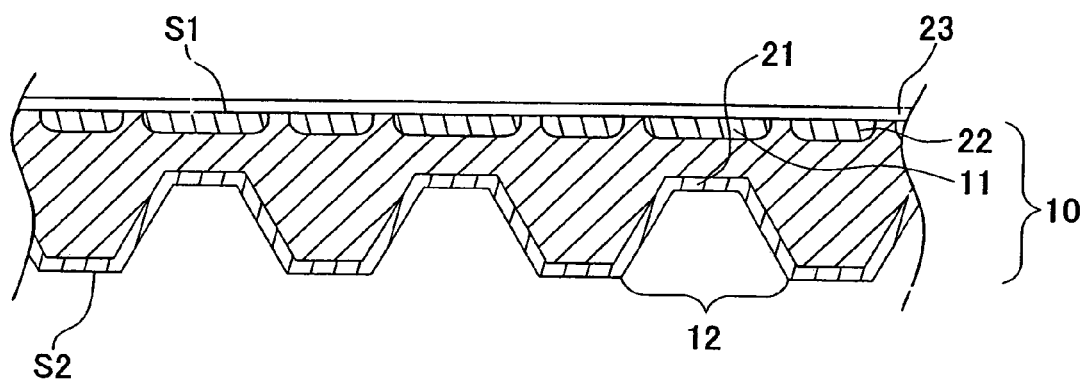
FIG. 8 is a step chart showing a method of manufacturing the back illuminated photodiode 1 shown in FIG. 1.
Figure 9:
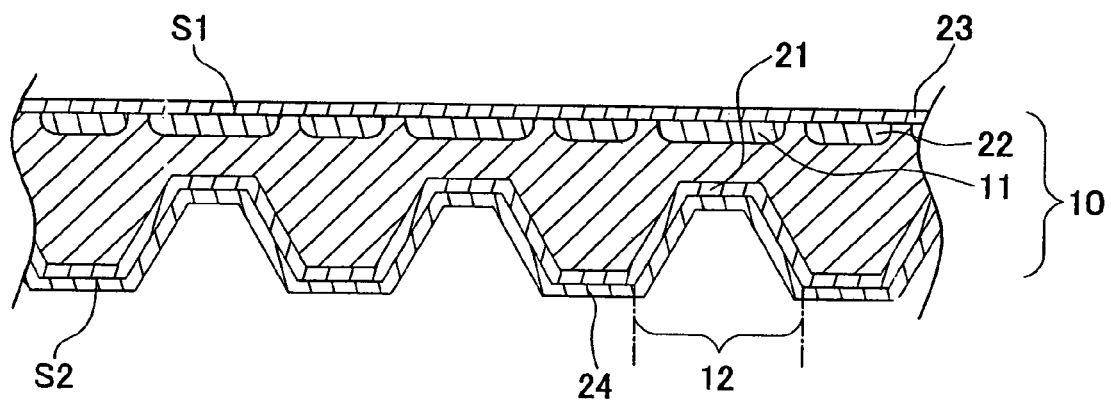
FIG. 9 is a step chart showing a method of manufacturing the back illuminated photodiode 1 shown in FIG. 1.
Figure 10:
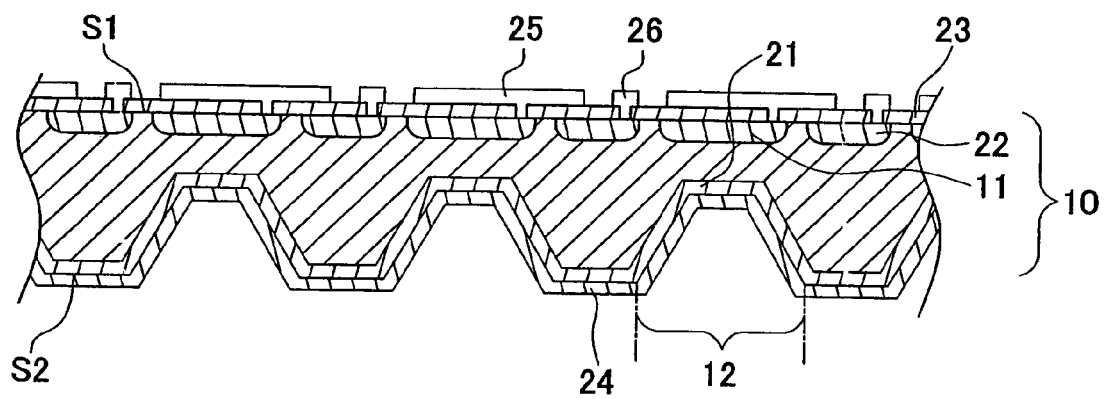
FIG. 10 is a step chart showing a method of manufacturing the back illuminated photodiode 1 shown in FIG. 1.

Next, after the SiN 84 on the rear surface S2 is removed, ion implantation, etc., is performed against the rear surface S2 of the N-type semiconductor substrate 10 with the recessed portions 12 formed therein to dope N-type impurities and thereby to form an $N^+$-type highly-doped impurity semiconductor layer 21 in the entire surface layer on the rear surface S2 side (FIG. 8). Then, the substrate is thermally oxidized to form an insulating film 24 on the rear surface S2 (FIG. 9). Contact holes for electrodes are formed in the insulating film 23 on the upper surface S1, and after aluminum is deposited on the upper surface S1, a predetermined pattern is made to form anode electrodes 25 and cathode electrodes 26 (FIG. 10).

Figure 11:
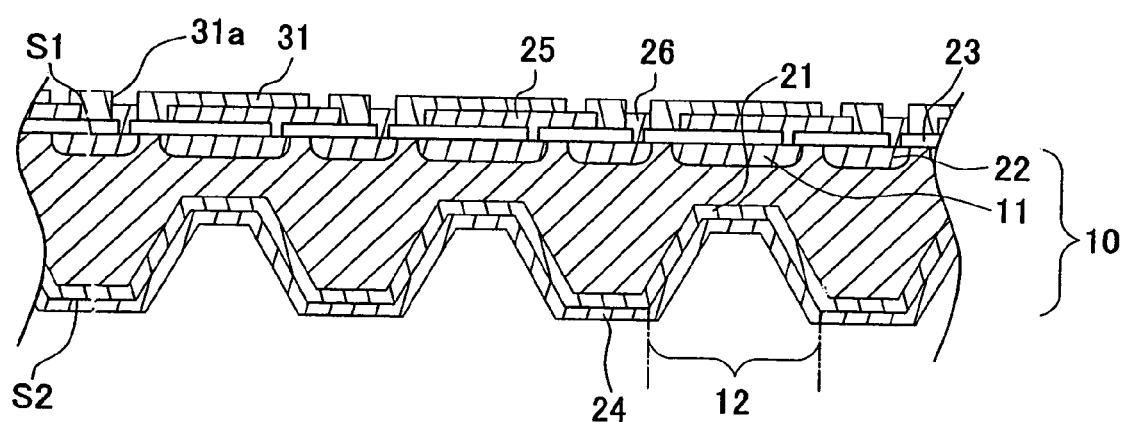
FIG. 11 is a step chart showing a method of manufacturing the back illuminated photodiode 1 shown in FIG. 1.
Figure 12:
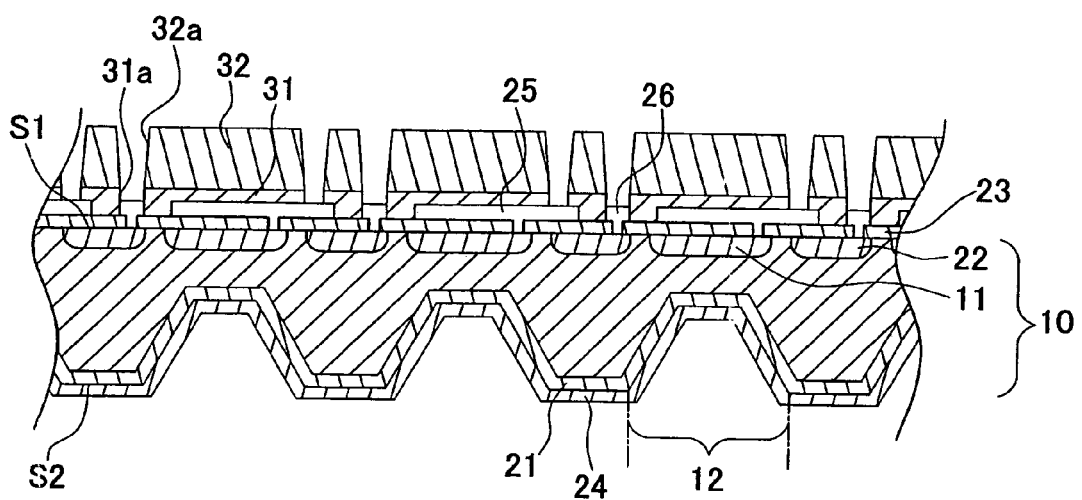
FIG. 12 is a step chart showing a method of manufacturing the back illuminated photodiode 1 shown in FIG. 1.
Figure 13:
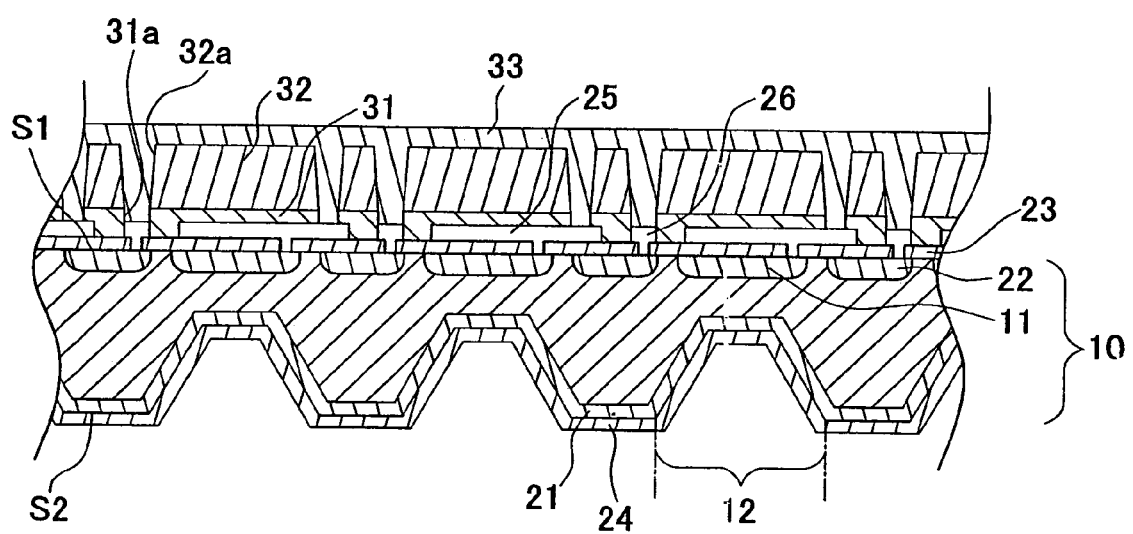
FIG. 13 is a step chart showing a method of manufacturing the back illuminated photodiode 1 shown in FIG. 1.

Next, a passivating film 31 made of SiN is deposited on the upper surface S1 of the N-type semiconductor substrate 10, on which the anode electrodes 25 and the cathode electrodes 26 are formed, by a plasma-CVD method. Also, openings 31a are formed in portions corresponding to bumps 35a and 35b within the passivating film 31 (FIG. 11). Further, a thick supporting film 32 made of resin or inorganic insulating films is formed on the upper surface S1, and openings 32a are formed in the portions corresponding to the openings 31a in the passivating film 31. Here, as the supporting film 32 resin such as epoxy-based, acryl-based or polyimide-based one, or inorganic insulating films such as $SiO_2$ that can be formed by, for example, CVD or SOG (Spin On Glass) can be used. Also, the openings 32a in the supporting film 32 can be formed by a photolithography method using, for example, photosensitive resin or by a patterning process such as etching (FIG. 12). Further, a conductive material 33 made of Cu is deposited on the upper surface S1 in such a manner as to fill the openings 31a and 32a. This can be made through the steps of, for example, depositing a Cu seed layer, etc., by sputtering, etc., on the surface of the anode electrodes 25 and the cathode electrodes 26 that are exposed from the openings 31a and 32a, and depositing Cu, etc., by plating on the Cu seed layer (FIG. 13).

Figure 14:
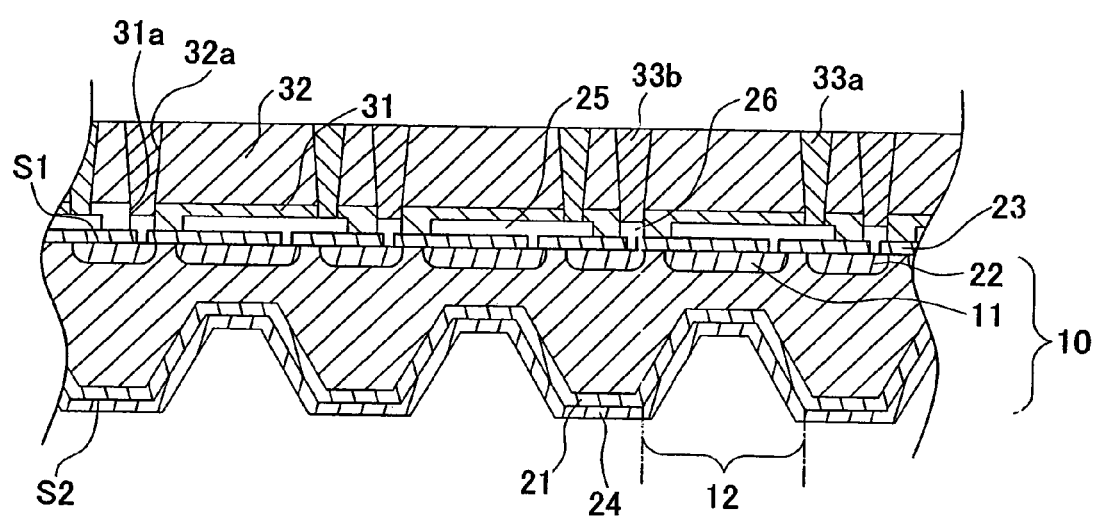
FIG. 14 is a step chart showing a method of manufacturing the back illuminated photodiode 1 shown in FIG. 1.
Figure 15:
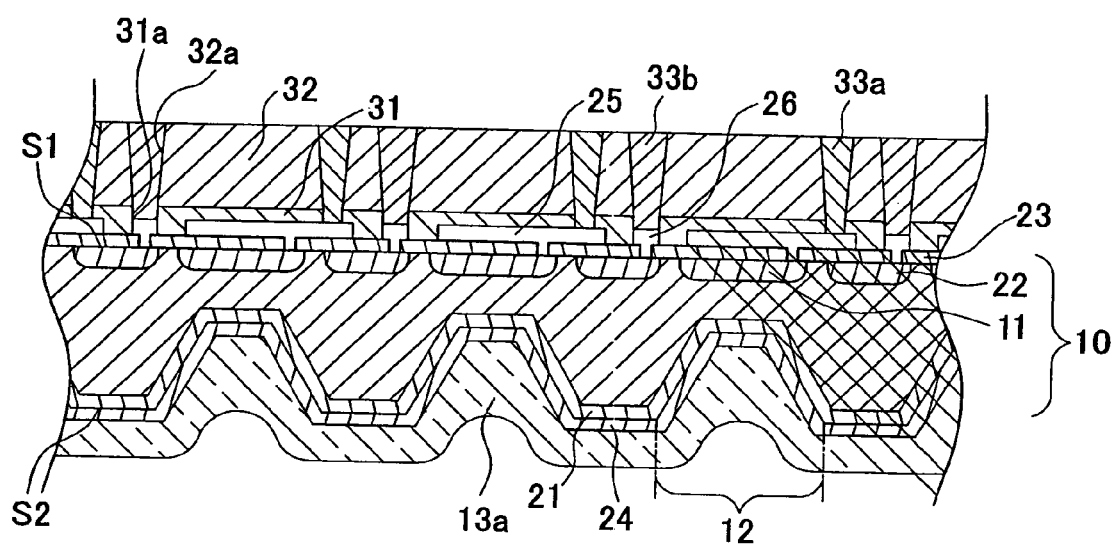
FIG. 15 is a step chart showing a method of manufacturing the back illuminated photodiode 1 shown in FIG. 1.
Figure 16:
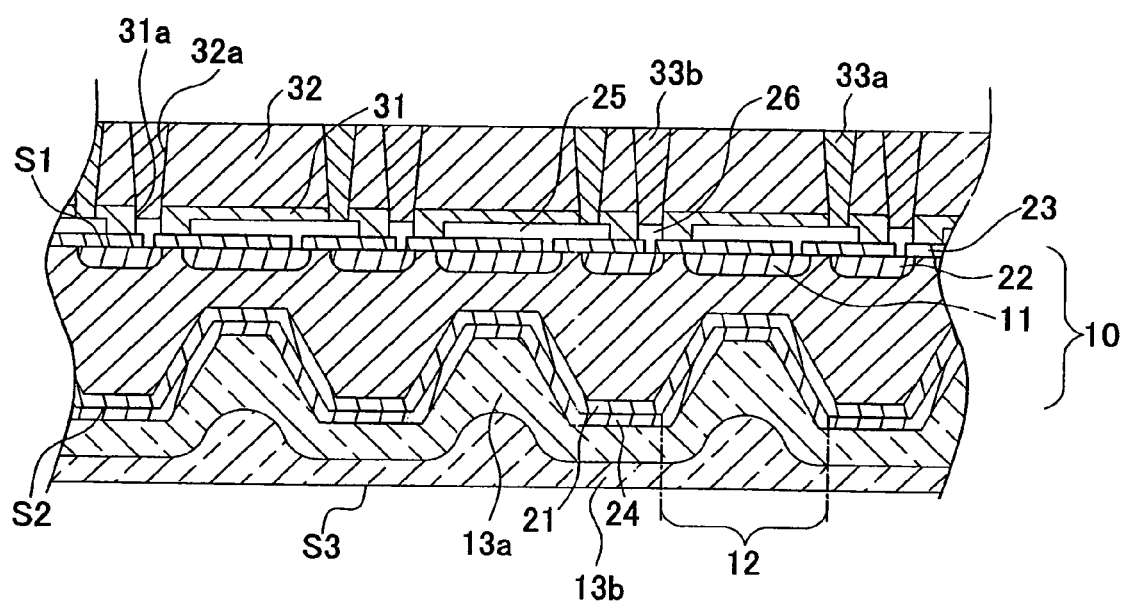
FIG. 16 is a step chart showing a method of manufacturing the back illuminated photodiode 1 shown in FIG. 1.

Next, the surface of the conductive material 33 is polished to remove the conductive material 33 deposited on the supporting film 32. Thus, filling electrodes 33a and 33b are formed (FIG. 14). Also, a resin layer 13a is applied onto the rear surface S2 by spin coating or printing, etc., and the applied resin layer 13a is hardened. Here, the portion of the resin layer 13a provided on the recessed portion 12 is to be sunk (FIG. 15). Further, a resin layer 13b is applied onto the resin layer 13a (FIG. 16).

Figure 17:
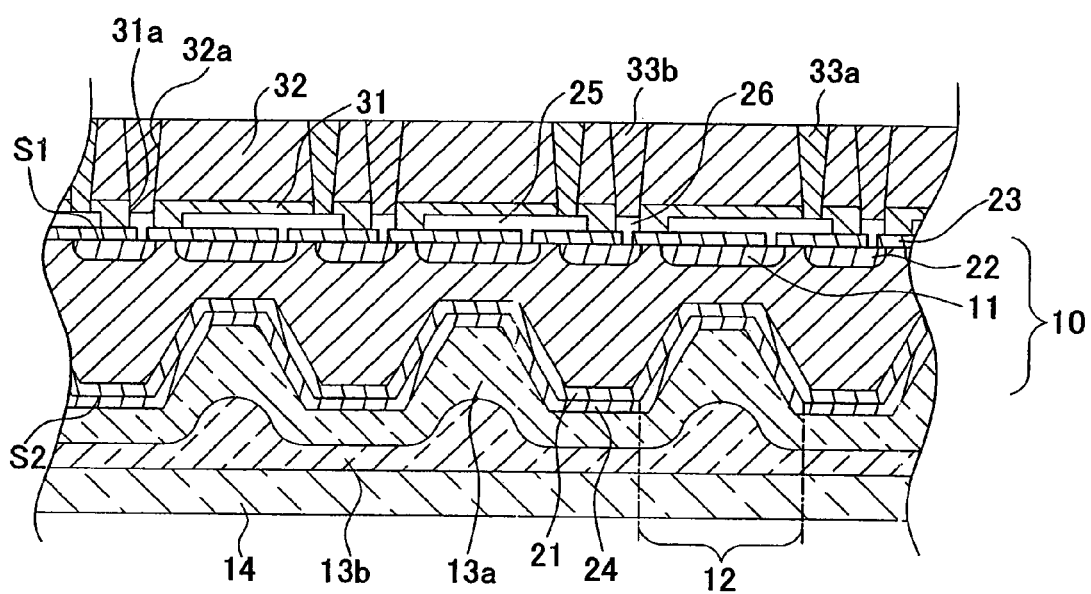
FIG. 17 is a step chart showing a method of manufacturing the back illuminated photodiode 1 shown in FIG. 1.
Figure 18:
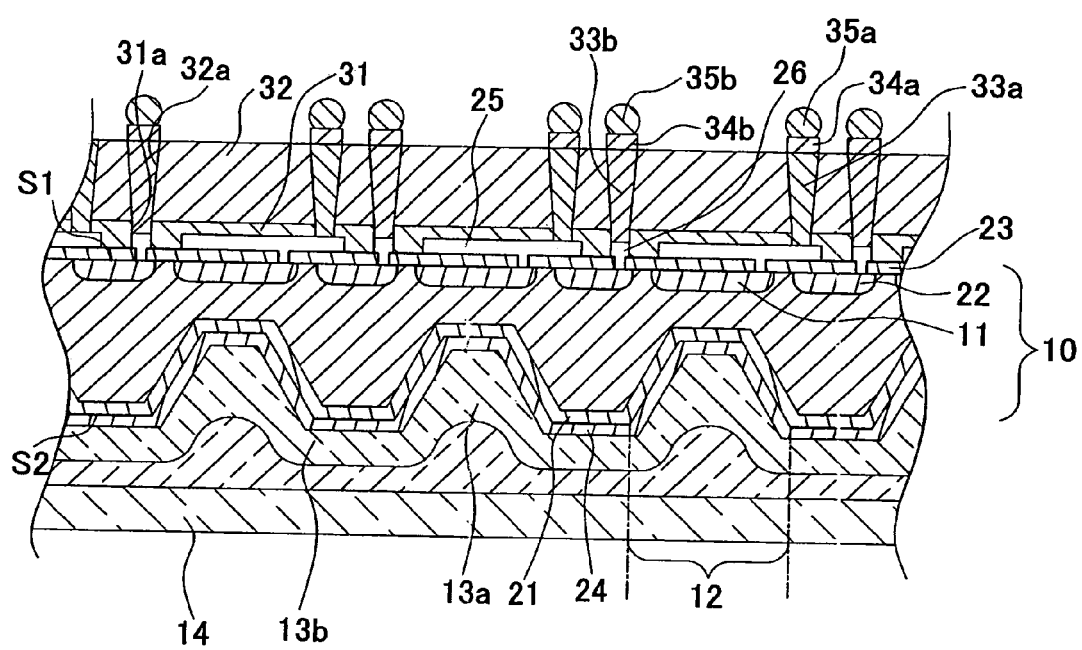
FIG. 18 is a step chart showing a method of manufacturing the back illuminated photodiode 1 shown in FIG. 1.
Figure 19:
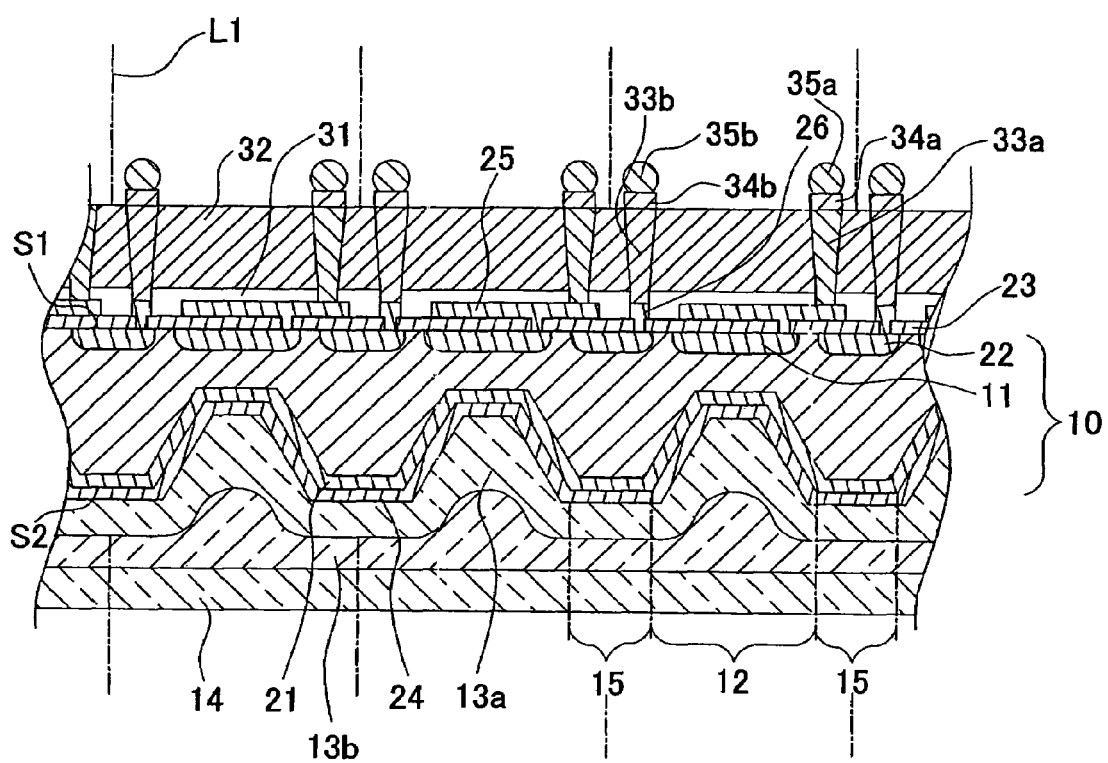
FIG. 19 is a step chart showing a method of manufacturing the back illuminated photodiode 1 shown in FIG. 1.

Next, a window plate 14 is bonded to the surface S3 of the resin layer 13b. Here, the window plate 14 is to be bonded before the resin layer 13b is hardened, so that the resin layer 13b can function as an adhesive material. Also, the window plate 14 is to be pressed lightly against the resin layer 13b in a bonding operation, so that the surface S3 of the resin layer 13b can be flattened sufficiently (FIG. 17). In addition, UBMs 34a and 34b composed of laminated films made of Ni and Au, etc., are formed on the filling electrodes 33a and 33b on the upper surface S1 by electroless plating. Further, bumps 35a and 35b made of solder, etc., are formed on the UBMs 34a and 34b by printing or a ball-mounting method, etc., (FIG. 18).

Figure 20:
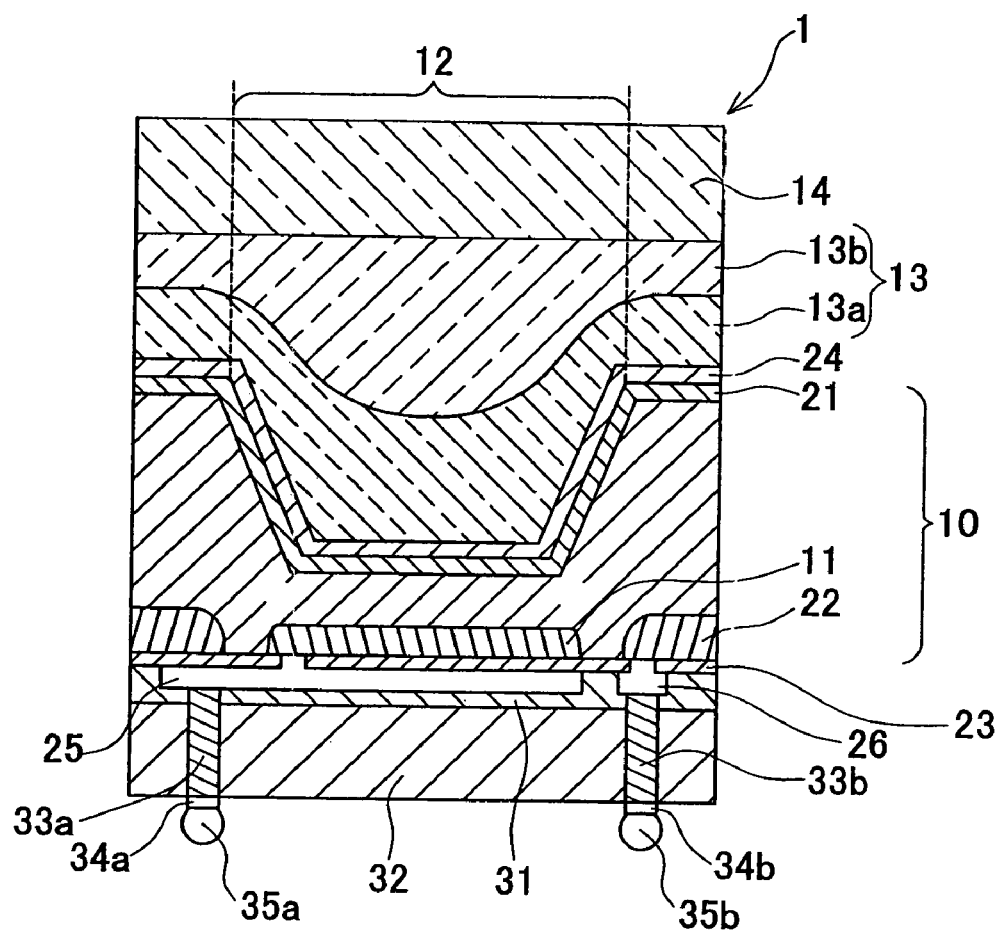
FIG. 20 is a step chart showing a method of manufacturing the back illuminated photodiode 1 shown in FIG. 1.

Finally, in order to obtain individually separated back illuminated photodiodes 1, dicing is performed. As indicated by the alternate long and short dashed lines L1 in FIG. 19, the N-type semiconductor substrate 10 is diced at the center of each outer edge portion 15 on the rear surface S2 side. There is thus obtained a back illuminated photodiode 1 (FIG. 20).

Figure 21:
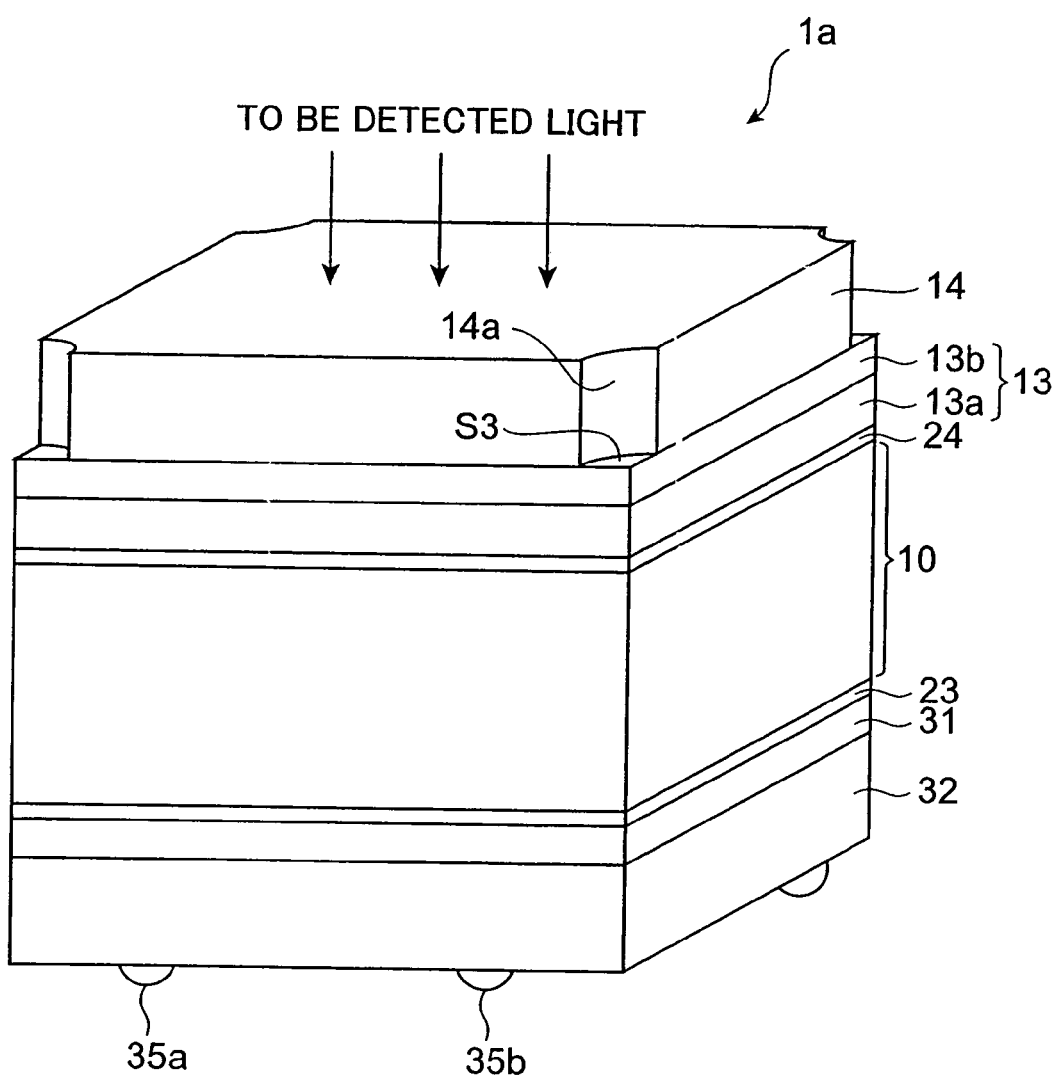
FIG. 21 is a perspective view showing an exemplary variation of the back illuminated photodiode 1 shown in FIG. 1.

FIG. 21 is a perspective view showing an exemplary variation of the back illuminated photodiode 1 shown in FIG. 1. The back illuminated photodiode 1a differs from the back illuminated photodiode 1 shown in FIG. 1 in that chamfered portions 14a are formed in the window plate 14. The other arrangements of the back illuminated photodiode 1a are the same as those of the back illuminated photodiode 1. As can be seen from FIG. 21, the window plate 14 has a square cross-sectional shape in a plane perpendicular to the thickness direction thereof, at the four corners of the square being formed chamfered portions 14a. The chamfered portions 14a each have a fan shape with a center angle of 90° centering on each corner of the square in the cross-section. Also, the surface S3 of the coating layer 13 (resin layer 13b) is exposed from the chamfered portions 14a. It is noted that the chamfered portions 14a are not restricted to have a fan shape in the cross-section, but may have a rectangular shape.

In the back illuminated photodiode 1a, the chamfered portions 14a are thus formed at the corners of the window plate 14, that is, at the positions where two dicing lines intersect with each other in a dicing operation, which prevents chipping (crack) in the dicing operation.

Figure 22:
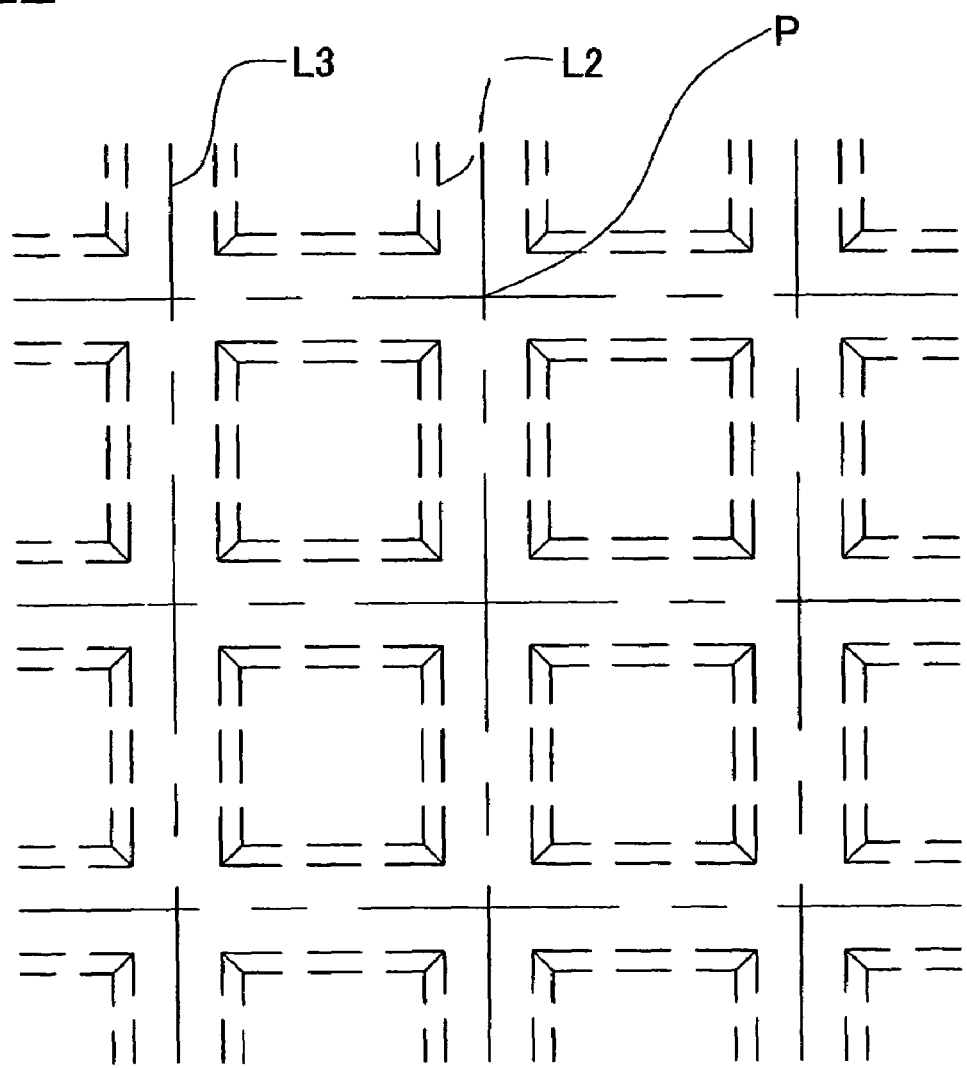
FIG. 22 is a plan view showing the appearance of the wafer of the back illuminated photodiode 1 shown in FIG. 21 before dicing, which is viewed from the side of the window plate 14.

The positional relationship between the window plate 14 and dicing lines will here be described with reference to FIG. 22. FIG. 22 is a plan view showing the appearance of the wafer of the back illuminated photodiode 1 shown in FIG. 1 before dicing (e.g. the wafer in a state shown in FIG. 19) when viewed from the side of the window plate 14. In this plan view, the portions where recessed portions 12 are formed are indicated by the dashed lines L2. It can be found that the recessed portions 12 are arranged in a grid pattern at a constant spacing in the wafer before dicing. Also, the dicing lines in a dicing operation are indicated by the alternate long and short dashed lines L3. The dicing lines are specified in the vertical direction or the horizontal direction in the figure, and run through the center of the space between adjacent recessed portions 12. Each area surrounded by the dicing lines corresponds to each back illuminated photodiode 1 after dicing. As can be seen from FIG. 22, the corners of the window plate 14 in each back illuminated photodiode 1 after dicing correspond to the positions P where two dicing lines intersect with each other. Since the positions in the N-type semiconductor substrate 10 corresponding to the positions P, that is, the four corners of the rear surface S2 receive stress in a concentrated manner in a dicing operation, there is a possibility of chipping.

On the contrary, in the back illuminated photodiode 1a shown in FIG. 21, at the corners of the window plate 14 are formed chamfered portions 14a, whereby the dicing of the window plate 14 at the positions P where dicing lines intersect with each other is avoided. This relaxes stress to be applied to the four corners of the rear surface S2 of the N-type semiconductor substrate 10, which prevents chipping in the back illuminated photodiode 1a in a dicing operation.

Figure 23:
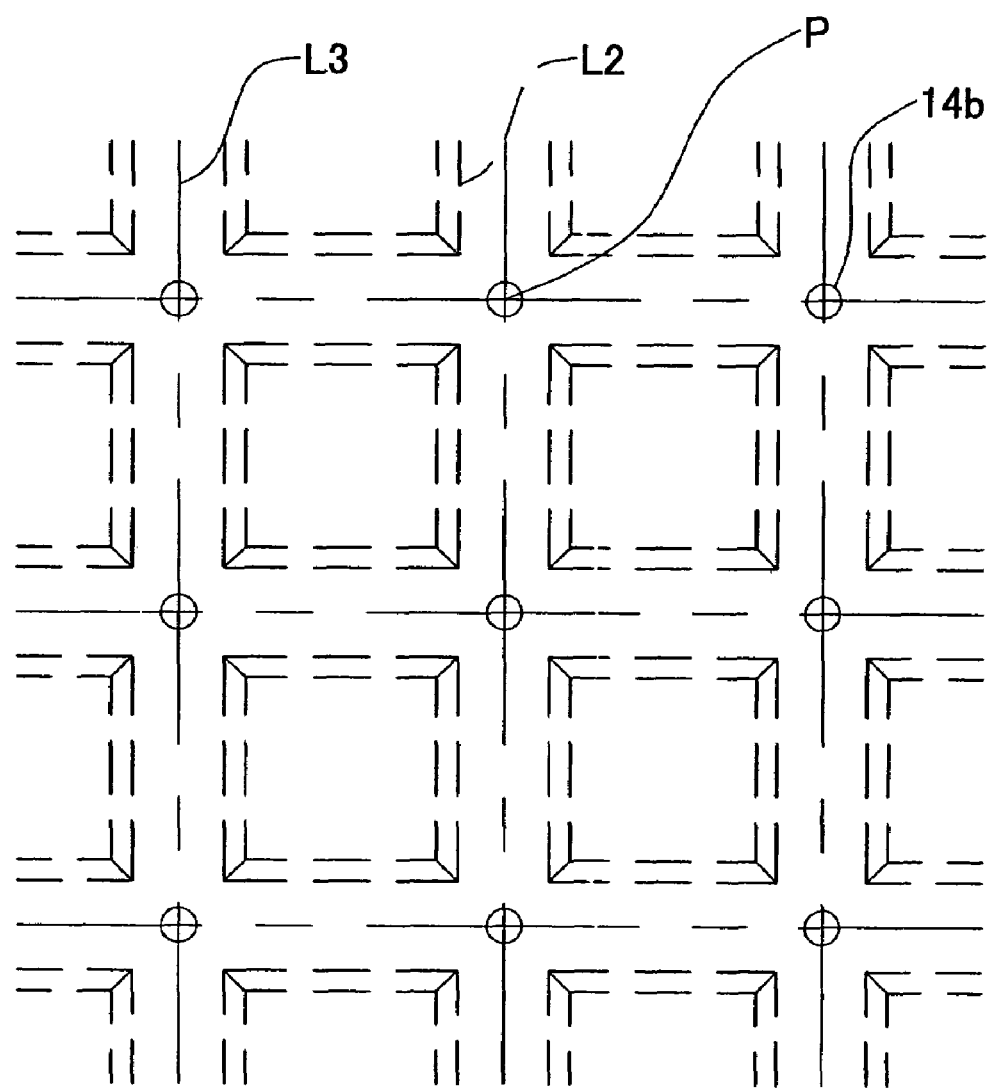
FIG. 23 is a plan view showing the appearance of the wafer of the back illuminated photodiode 1a shown in FIG. 21 before dicing, which is viewed from the side of the window plate 14.

FIG. 23 is a plan view showing the appearance of the wafer of the back illuminated photodiode 1a shown in FIG. 21 before dicing when viewed from the side of the window plate 14. As shown in this plan view, at the positions P where dicing lines intersect with each other are formed cylindrical hole portions 14b. The hole portions 14b are formed in and penetrate through each window plate 14. The chamfered portions 14a derive from these hole portions 14b. That is, each hole portion 14b is to be divided into quarters by a dicing operation to be chamfered portions 14a in the back illuminated photodiode 1a. It is noted that in the manufacturing process for the back illuminated photodiode 1a, it is only required to bond the window plate 14 with the hole portions 14b formed preliminarily at predetermined positions thereof to the surface S3 of the coating layer 13 so that the positions P where dicing lines intersect with each other are aligned with the hole portions 14b. It is also noted that the hole portions 14b are not restricted to have a cylindrical shape, but may have a prismatic shape.

Figure 24:
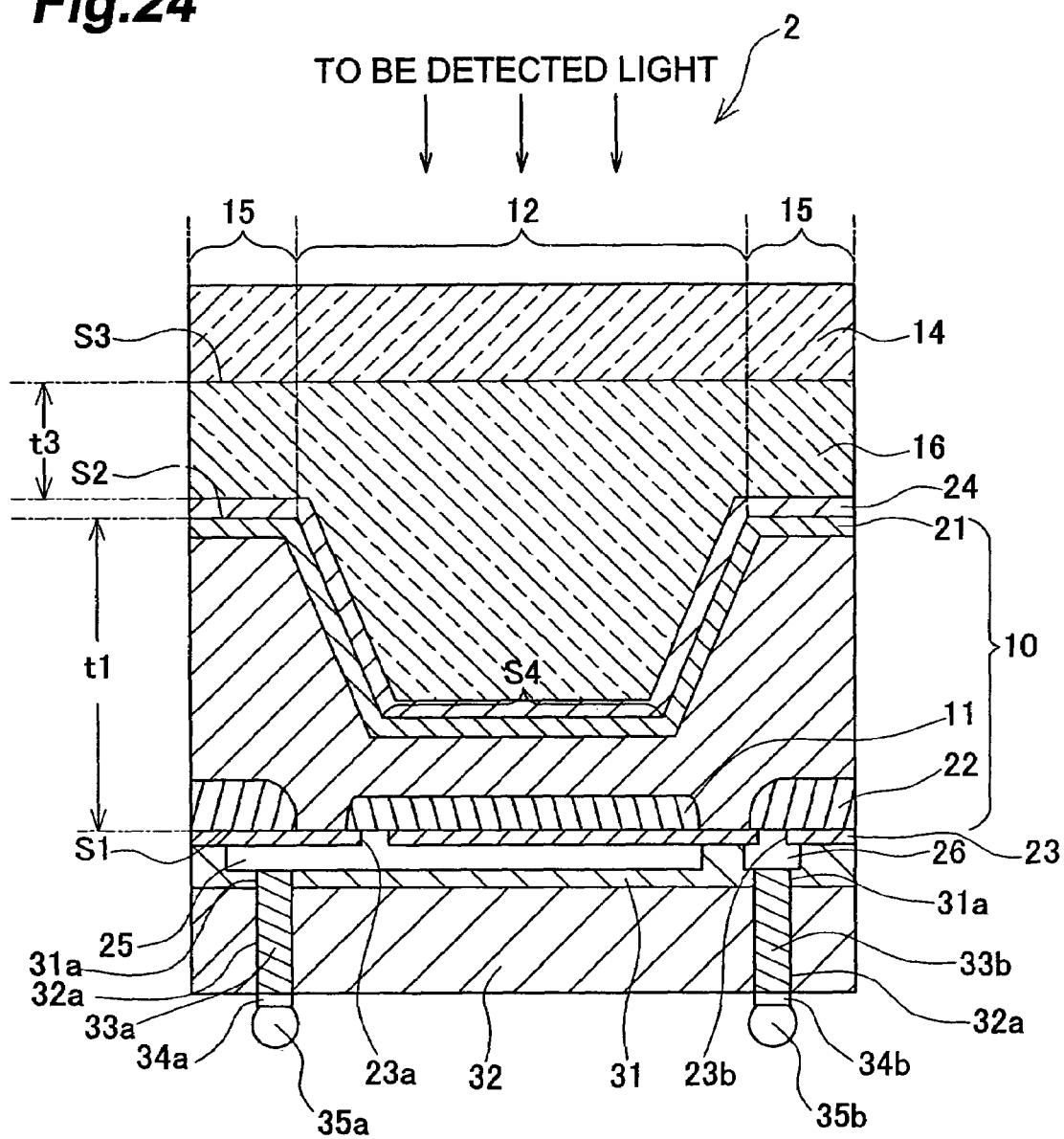
FIG. 24 is a cross-sectional view showing a second embodiment of a back illuminated photodetector according to the present invention.

FIG. 24 is a cross-sectional view showing a second embodiment of a back illuminated photodetector according to the present invention. The back illuminated photodiode 2 comprises an N-type semiconductor substrate 10, a P$^+$-type impurity semiconductor region 11, a recessed portion 12, a coating layer 16, and a window plate 14. In the surface layer on the upper surface S1 side of the N-type semiconductor substrate 10 is partially formed the P$^+$-type impurity semiconductor region 11. In the rear surface S2 of the N-type semiconductor substrate 10 and in an area opposite to the P$^+$-type impurity semiconductor region 11 is formed the recessed portion 12.

On the rear surface S2 of the N-type semiconductor substrate 10 is provided the coating layer 16. The coating layer 16 is made of resin transparent to to-be-detected light, and is provided on the rear surface S2 of the N-type semiconductor substrate 10. Also, the surface S3 of the coating layer 16 has a substantially flat shape. Unlike the coating layer 13 shown in FIG. 1, which is composed of two resin layers 13a and 13b, the coating layer 16 is composed of one layer. The thickness t3 of the coating layer 16 is 1 to 100 μm, for example, and preferably approximately 20 μm with reference to the outer edge portion 15. On the surface S3 of the coating layer 16 is also provided the window plate 14.

The back illuminated photodiode 2 also comprises an N$^+$-type highly-doped impurity semiconductor layer 21, an N$^+$-type highly-doped impurity semiconductor region 22, insulating films 23 and 24, an anode electrode 25, and a cathode electrode 26. The N$^+$-type highly-doped impurity semiconductor layer 21 is formed in the entire surface layer on the rear surface S2 side of the N-type semiconductor substrate 10. The N$^+$-type highly-doped impurity semiconductor region 22 is formed in the surface layer on the upper surface S1 side of the N-type semiconductor substrate 10 at a predetermined distance from the P$^+$-type impurity semiconductor region 11. The insulating films 23 and 24 are formed, respectively, on the upper surface S1 and the rear surface S2 of the N-type semiconductor substrate 10. In the insulating film 23 are formed openings 23a and 23b. On the insulating film 23 and in the areas including the openings 23a and 23b are formed, respectively, the anode electrode 25 and the cathode electrode 26.

The back illuminated photodiode 2 further comprises a passivating film 31, a supporting film 32, filling electrodes 33a and 33b, UBMs 34a and 34b, and bumps 35a and 35b. The passivating film 31 is provided on the upper surface S1 of the N-type semiconductor substrate 10 in such a manner as to cover the insulating film 23, anode electrode 25, and cathode electrode 26. On the passivating film 31 is formed the supporting film 32. Also, the filling electrodes 33a and 33b penetrate through the passivating film 31 and the supporting film 32 to extend, respectively, from the anode electrode 25 and the cathode electrode 26 to the surface of the supporting film 32. On the exposed portions of the filling electrodes 33a and 33b at the surface of the supporting film 32 are formed the UBMs 34a and 34b. On the surfaces of the UBMs 34a and 34b on the opposite side of the filling electrodes 33a and 33b are formed the bumps 35a and 35b.

The effect of the back illuminated photodiode 2 will here be described. In the back illuminated photodiode 2, since there is provided the coating layer 16, the mechanical strength of the back illuminated photodiode 2 is increased. Also, the increase in mechanical strength allows for dicing per whole wafer, whereby it is possible to obtain a chip-sized back illuminated photodiode 2. Accordingly, there is achieved a back illuminated photodiode 2 having a sufficiently small package.

Further, the window plate 14 is provided on the surface S3 of the coating layer 16. Therefore, the surface of the window plate 14 functions as an incident plane for to-be-detected light, whereby it is possible to suppress the scattering of to-be-detected light at the incident plane. In addition, since the interface between the window plate 14 and the coating layer 16, that is, the surface S3 of the coating layer 16 is to be flattened sufficiently, it is also possible to suppress the scattering of to-be-detected light at the surface S3 of the coating layer 16. Accordingly, it is possible to achieve a highly sensitive back illuminated photodiode 2.

Also, in the back illuminated photodiode 2, the coating layer 16 is composed of one layer. This allows the manufacturing process for the coating layer 16 to be made simpler than that for the coating layer 13 shown in FIG. 1, which is composed of two layers, and therefore the manufacturing process for the entire back illuminated photodiode 2 to be simplified.

Figure 25:
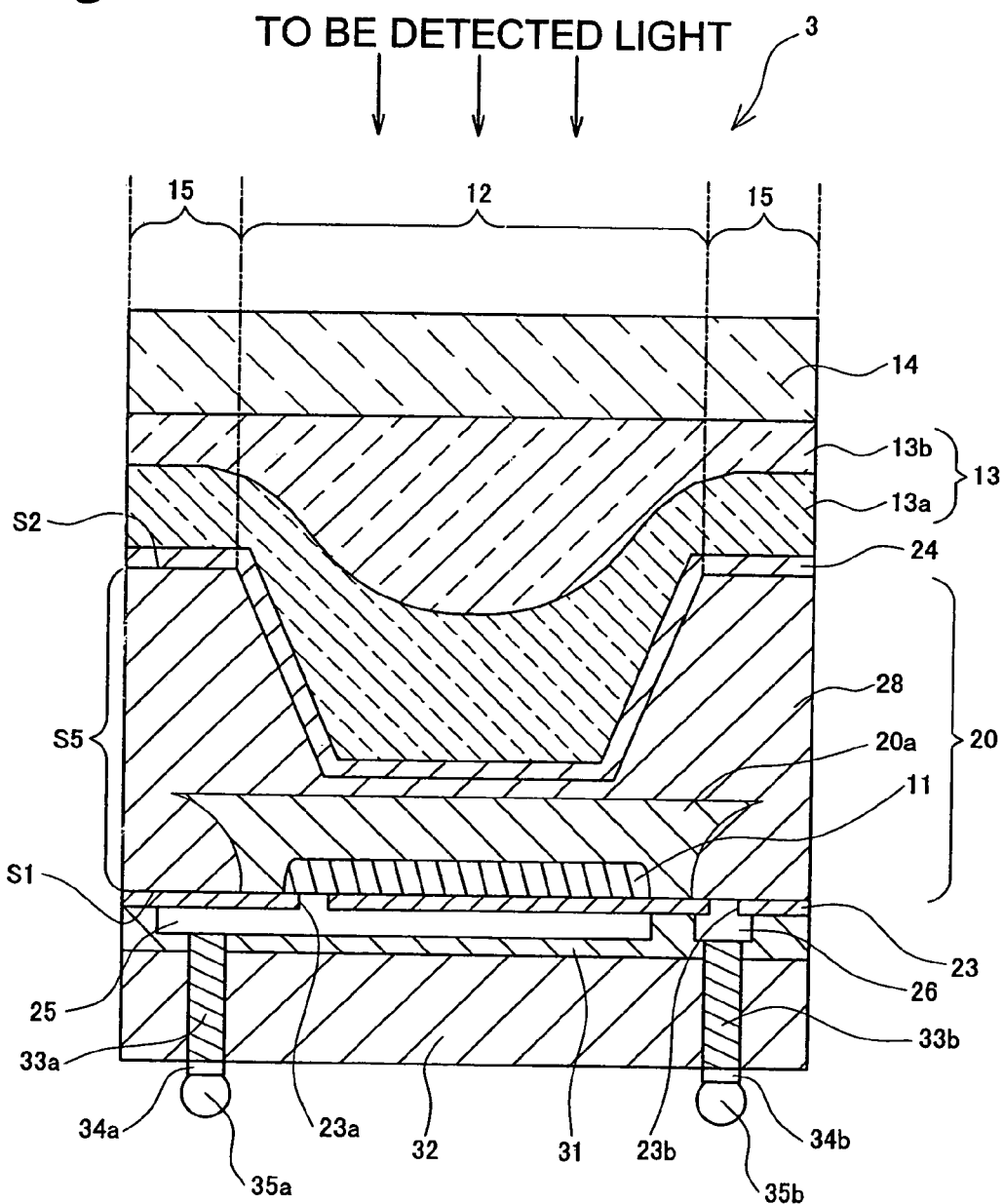
FIG. 25 is a cross-sectional view showing a third embodiment of a back illuminated photodetector according to the present invention.

FIG. 25 is a cross-sectional view showing a third embodiment of a back illuminated photodetector according to the present invention. The back illuminated photodiode 3 comprises an N-type semiconductor substrate 20, a P$^+$-type impurity semiconductor region 11, a recessed portion 12, a coating layer 13, and a window plate 14.

In the surface layer on the upper surface S1 side of the N-type semiconductor substrate 20 is partially formed the P$^+$-type impurity semiconductor region 11. In the rear surface S2 of the N-type semiconductor substrate 20 and in an area opposite the P$^+$-type impurity semiconductor region 11 is formed the recessed portion 12. On the rear surface S2 of the N-type semiconductor substrate 20 is provided the coating layer 13 composed of resin layers 13a and 13b. The surface S3 of the coating layer 13 has a substantially flat shape. On the surface S3 of the coating layer 13 is also provided the window plate 14.

The back illuminated photodiode 3 also comprises an N$^+$-type highly-doped impurity semiconductor region 28, insulating films 23 and 24, an anode electrode 25, and a cathode electrode 26. The N$^+$-type highly-doped impurity semiconductor region 28 is formed in such a manner as to be exposed at the entire side surfaces S5 of the N-type semiconductor substrate 20. The N+-type highly-doped impurity semiconductor region 28 also reaches the entire rear surface S2 of the N-type semiconductor substrate 20. Therefore, the portion 20a within the N-type semiconductor substrate 20, in which neither the P+-type impurity semiconductor region 11 nor the N+-type highly-doped impurity semiconductor region 28 is formed, is surrounded entirely by the N+-type highly-doped impurity semiconductor region 28 from the side surface S5 sides and the rear surface S2 side of the N-type semiconductor substrate 20.

Figure 26:
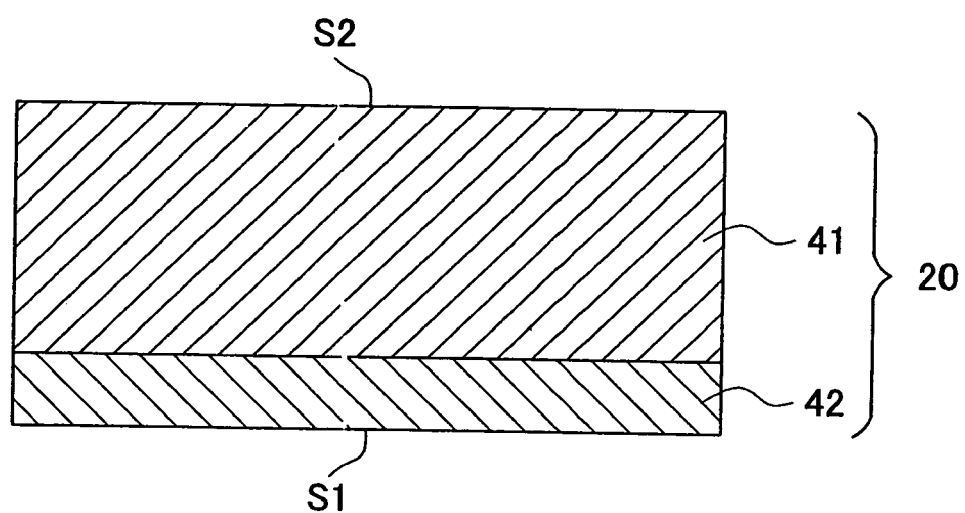
FIG. 26 is a view illustrating an exemplary method of forming the N$^+$-type highly-doped impurity semiconductor region 28 shown in FIG. 25.
Figure 27:
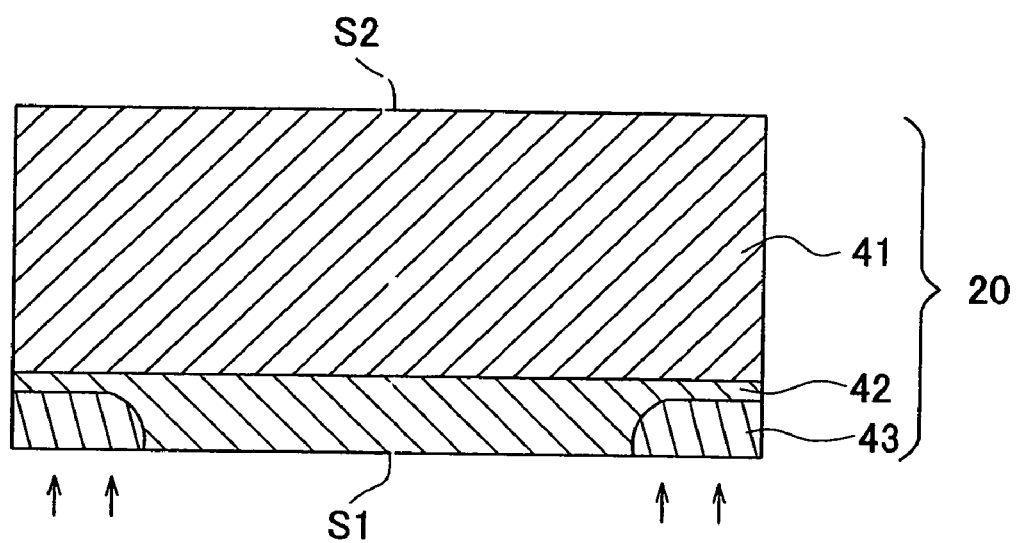
FIG. 27 is a view illustrating an exemplary method of forming the N$^+$-type highly-doped impurity semiconductor region 28 shown in FIG. 25.
Figure 28:
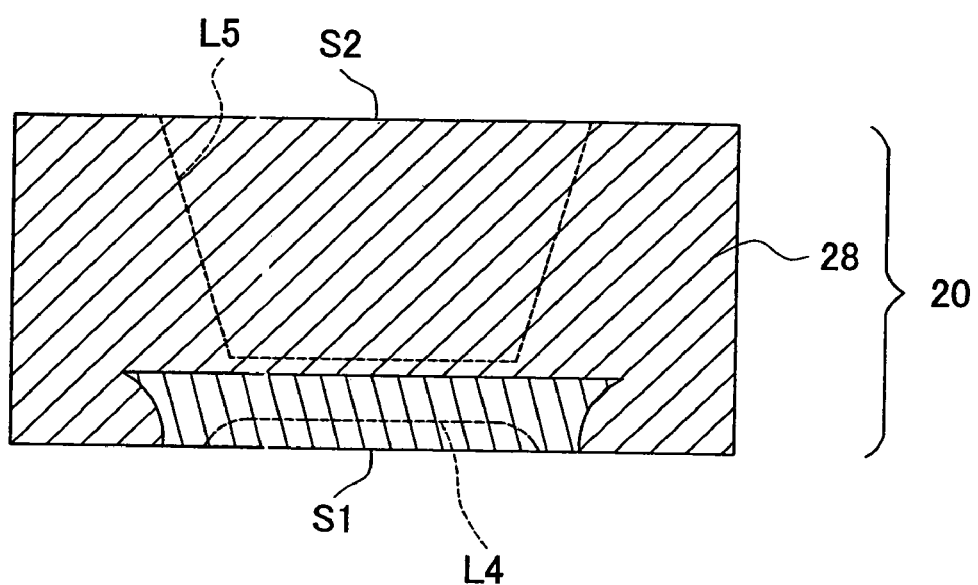
FIG. 28 is a view illustrating an exemplary method of forming the N$^+$-type highly-doped impurity semiconductor region 28 shown in FIG. 25.

An exemplary method of forming the N+-type highly-doped impurity semiconductor region 28 will here be described with reference to FIGS. 26 to 28. First, there is prepared an N-type semiconductor substrate 20. In the N-type semiconductor substrate 20, an N+-type highly-doped impurity semiconductor layer 41 is diffused from the rear surface S2 with a part on the upper surface S1 side remaining left. The left part on the upper surface S1 side is an N-type impurity semiconductor layer 42 having an impurity concentration lower than that of the N+-type highly-doped impurity semiconductor layer 41 (FIG. 26). Next, N-type impurities are doped at a high concentration from the upper surface S1 side to form N+-type highly-doped impurity semiconductor regions 43 (FIG. 27). Then, the N-type impurities are diffused further deeply by heat treatment so that the N+-type highly-doped impurity semiconductor regions 43 reach the N+-type highly-doped impurity semiconductor layer 41 (FIG. 28). There is thus formed an N+-type highly-doped impurity semiconductor region 28 composed of the N+-type highly-doped impurity semiconductor layer 41 and the N+-type highly-doped impurity semiconductor regions 43. It is noted that in FIG. 28, the areas where a P+-type impurity semiconductor region 11 and a recessed portion 12 are to be formed are indicated, respectively, by the dashed lines L4 and L5. In accordance with the method, since it is possible to omit the process of doping impurities from the rear surface S2 side of the N-type semiconductor substrate 20, the manufacturing process for the N+-type highly-doped impurity semiconductor region 28 and therefore for the entire back illuminated photodiode 3 is simplified.

Returning to FIG. 25, on the upper surface S1 and the rear surface S2 of the N-type semiconductor substrate 20 are formed, respectively, the insulating films 23 and 24. Also, in the insulating film 23 are formed openings 23a and 23b, one opening 23a being provided within the range of the P+-type impurity semiconductor region 11, while the other opening 23b being provided within the range of the N+-type highly-doped impurity semiconductor region 28.

On the insulating film 23 and in the areas including the openings 23a and 23b are formed, respectively, the anode electrode 25 and the cathode electrode 26. The electrodes 25 and 26 are provided in such a manner as to fill the respective openings 23a and 23b. Thus, the anode electrode 25 is connected directly to the P+-type impurity semiconductor region 11 through the opening 23a, while the cathode electrode 26 is connected directly to the N+-type highly-doped impurity semiconductor region 28 through the opening 23b.

The back illuminated photodiode 2 further comprises a passivating film 31, a supporting film 32, filling electrodes 33a and 33b, UBMs 34a and 34b, and bumps 35a and 35b. The passivating film 31 is provided on the upper surface S1 of the N-type semiconductor substrate 20 in such a manner as to cover the insulating film 23, anode electrode 25, and cathode electrode 26. On the passivating film 31 is formed the supporting film 32. Also, the filling electrodes 33a and 33b penetrate through the passivating film 31 and the supporting film 32 to extend, respectively, from the anode electrode 25 and the cathode electrode 26 to the surface of the supporting film 32. On the exposed portions of the filling electrodes 33a and 33b at the surface of the supporting film 32 are formed the UBMs 34a and 34b. On the surfaces of the UBMs 34a and 34b on the opposite side of the filling electrodes 33a and 33b are formed the bumps 35a and 35b.

The effect of the back illuminated photodiode 3 will here be described. In the back illuminated photodiode 3, since there is provided the coating layer 13, the mechanical strength of the back illuminated photodiode 3 is increased. Also, the increase in mechanical strength allows for dicing per whole wafer, whereby it is possible to obtain a chip-sized back illuminated photodiode 3. Accordingly, there is achieved a back illuminated photodiode 3 having a sufficiently small package.

Further, the window plate 14 is provided on the surface S3 of the coating layer 13. Therefore, the surface of the window plate 14 functions as an incident plane for to-be-detected light, whereby it is possible to suppress the scattering of to-be-detected light at the incident plane. In addition, since the interface between the window plate 14 and the coating layer 13, that is, the surface S3 of the coating layer 13 is to be flattened sufficiently, it is also possible to suppress the scattering of to-be-detected light at the surface S3 of the coating layer 13. Accordingly, it is possible to achieve a highly sensitive back illuminated photodiode 3.

Also, in the back illuminated photodiode 3, the N+-type highly-doped impurity semiconductor region 28 is formed in such a manner as to be exposed at the entire side surfaces S5 of the N-type semiconductor substrate 20. Thus, the N+-type highly-doped impurity semiconductor region 28 can suppress dark current and/or noise caused by unnecessary carriers that are generated in the vicinity of the side surfaces S5 of the N-type semiconductor substrate 20 due to damage, etc., in a dicing operation. Although the side surfaces S5 correspond to dicing lines whereby there is a possibility of causing crystal defects in a dicing operation, the N+-type highly-doped impurity semiconductor region 28 can also suppress dark current and/or noise due to the crystal defects. Therefore, in accordance with the back illuminated photodiode 3, it is possible to obtain a detected signal at a high S/N ratio.

In addition, the portion 20a within the N-type semiconductor substrate 20 is surrounded entirely by the N+-type highly-doped impurity semiconductor region 28 from the side surface S5 sides and the rear surface S2 side of the N-type semiconductor substrate 20. There is thus achieved a PIN structure in which the surrounded portion 20a is employed as an I-layer. Therefore, the back illuminated photodiode 3 achieves a sensitivity increase due to such a PIN structure whereby the depletion layer is thickened to increase the length through which light is absorbed, and a high-speed response due to the thus thickened depletion layer whereby the thickness of the electric double layer is increased to reduce the capacitance thereof.

Figure 29:
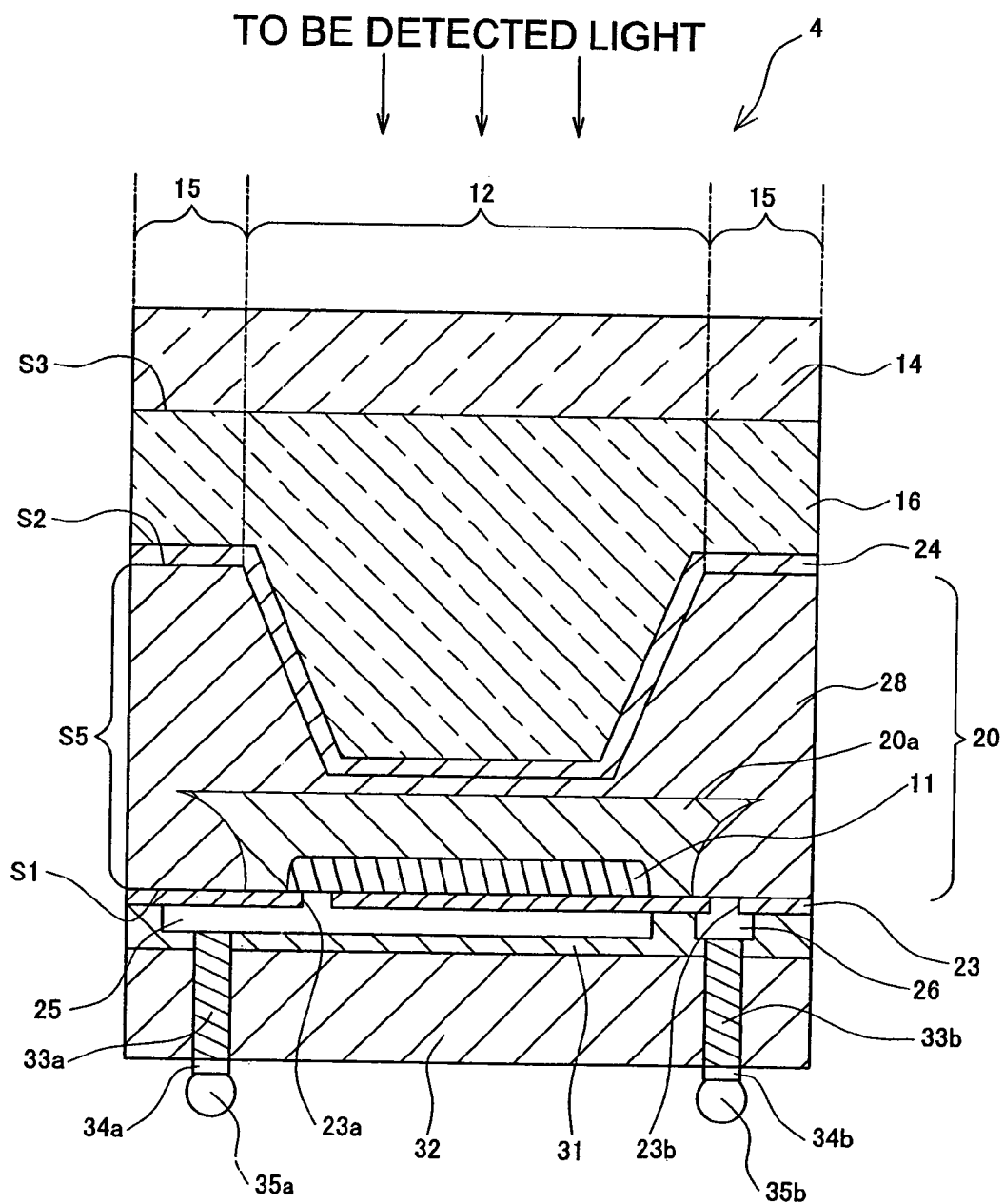
FIG. 29 is a cross-sectional view showing a fourth embodiment of a back illuminated photodetector according to the present invention.

FIG. 29 is a cross-sectional view showing a fourth embodiment of a back illuminated photodetector according to the present invention. The back illuminated photodiode 4 comprises an N-type semiconductor substrate 20, a P+-type impurity semiconductor region 11, a recessed portion 12, a coating layer 16, and a window plate 14. In the surface layer on the upper surface S1 side of the N-type semiconductor substrate 20 is partially formed the P+-type impurity semiconductor region 11. In the rear surface S2 of the N-type semiconductor substrate 20 and in an area opposite the P+-type impurity semiconductor region 11 is formed the recessed portion 12.

On the rear surface S2 of the N-type semiconductor substrate 20 is provided the coating layer 16. The coating layer 16 is made of resin transparent to to-be-detected light, and is provided on the rear surface S2 of the N-type semiconductor substrate 20. Also, the surface S3 of the coating layer 16 has a substantially flat shape. On the surface S3 of the coating layer 16 is provided the window plate 14.

The back illuminated photodiode 4 also comprises an $N^+$-type highly-doped impurity semiconductor region 28, insulating films 23 and 24, an anode electrode 25, and a cathode electrode 26. The $N^+$-type highly-doped impurity semiconductor region 28 is formed in such a manner as to be exposed at the entire side surfaces S5 of the N-type semiconductor substrate 20. The $N^+$-type highly-doped impurity semiconductor region 28 also reaches the entire rear surface S2 of the N-type semiconductor substrate 20. Therefore, the portion 20a within the N-type semiconductor substrate 20, in which neither the $P^+$-type impurity semiconductor region 11 nor the $N^+$-type highly-doped impurity semiconductor region 28 is formed, is surrounded entirely by the $N^+$-type highly-doped impurity semiconductor region 28 from the side surface S5 sides and the rear surface S2 side of the N-type semiconductor substrate 20.

On the upper surface S1 and the rear surface S2 of the N-type semiconductor substrate 20 are formed, respectively, the insulating films 23 and 24. Also, in the insulating film 23 are formed openings 23a and 23b, one opening 23a being provided within the range of the $P^+$-type impurity semiconductor region 11, while the other opening 23b being provided within the range of the $N^+$-type highly-doped impurity semiconductor region 28.

On the insulating film 23 and in the areas including the openings 23a and 23b are formed, respectively, the anode electrode 25 and the cathode electrode 26. The electrodes 25 and 26 are provided in such a manner as to fill the respective openings 23a and 23b. Thus, the anode electrode 25 is connected directly to the $P^+$-type impurity semiconductor region 11 via the opening 23a, while the cathode electrode 26 is connected directly to the $N^+$-type highly-doped impurity semiconductor region 28 via the opening 23b.

The back illuminated photodiode 4 further comprises a passivating film 31, a supporting film 32, filling electrodes 33a and 33b, UBMs 34a and 34b, and bumps 35a and 35b. The passivating film 31 is provided on the upper surface S1 of the N-type semiconductor substrate 20 in such a manner as to cover the insulating film 23, anode electrodes 25, and cathode electrodes 26. On the passivating film 31 is formed the supporting film 32. Also, the filling electrodes 33a and 33b penetrate through the passivating film 31 and the supporting film 32 to extend, respectively, from the anode electrodes 25 and the cathode electrodes 26 to the surface of the supporting film 32. On the exposed portions of the filling electrodes 33a and 33b at the surface of the supporting film 32 are formed the UBMs 34a and 34b. On the surfaces of the UBMs 34a and 34b on the opposite side of the filling electrodes 33a and 33b are formed the bumps 35a and 35b.

The effect of the back illuminated photodiode 4 will here be described. In the back illuminated photodiode 4, since there is provided the coating layer 16, the mechanical strength of the back illuminated photodiode 4 is increased. Also, the increase in mechanical strength allows for dicing per whole wafer, whereby it is possible to obtain a chip-sized back illuminated photodiode 4. Accordingly, there is achieved a back illuminated photodiode 4 having a sufficiently small package.

Further, the window plate 14 is provided on the surface S3 of the coating layer 16. Therefore, the surface of the window plate 14 functions as an incident plane for to-be-detected light, whereby it is possible to suppress the scattering of to-be-detected light at the incident plane. In addition, since the interface between the window plate 14 and the coating layer 16, that is, the surface S3 of the coating layer 16 is to be flattened sufficiently, it is also possible to suppress the scattering of to-be-detected light at the surface S3 of the coating layer 16. Accordingly, it is possible to achieve a highly sensitive back illuminated photodiode 4.

Also, in the back illuminated photodiode 4, the coating layer 16 is composed of one layer. This allows the manufacturing process for the coating layer 16 and therefore for the entire back illuminated photodiode 4 to be simplified.

In addition, in the back illuminated photodiode 4, the $N^+$-type highly-doped impurity semiconductor region 28 is formed in such a manner as to be exposed at the entire side surfaces S5 of the N-type semiconductor substrate 20. Thus, the $N^+$-type highly-doped impurity semiconductor region 28 can suppress dark current and/or noise caused by unnecessary carriers that are generated in the vicinity of the side surfaces S5 of the N-type semiconductor substrate 20 due to damage, etc., in a dicing operation. Therefore, in accordance with the back illuminated photodiode 4, it is possible to obtain a detected signal at a high S/N ratio. Further, the portion 20a within the N-type semiconductor substrate 20 is surrounded entirely by the $N^+$-type highly-doped impurity semiconductor region 28 from the side surface S5 sides and the rear surface S2 side of the N-type semiconductor substrate 20. Therefore, the back illuminated photodiode 4 achieves a sensitivity increase due to such a PIN structure whereby the depletion layer is thickened to increase the length through which light is absorbed, and a high-speed response due to the thus thickened depletion layer whereby the thickness of the electric double layer is increased to reduce the capacitance thereof.

Figure 30:
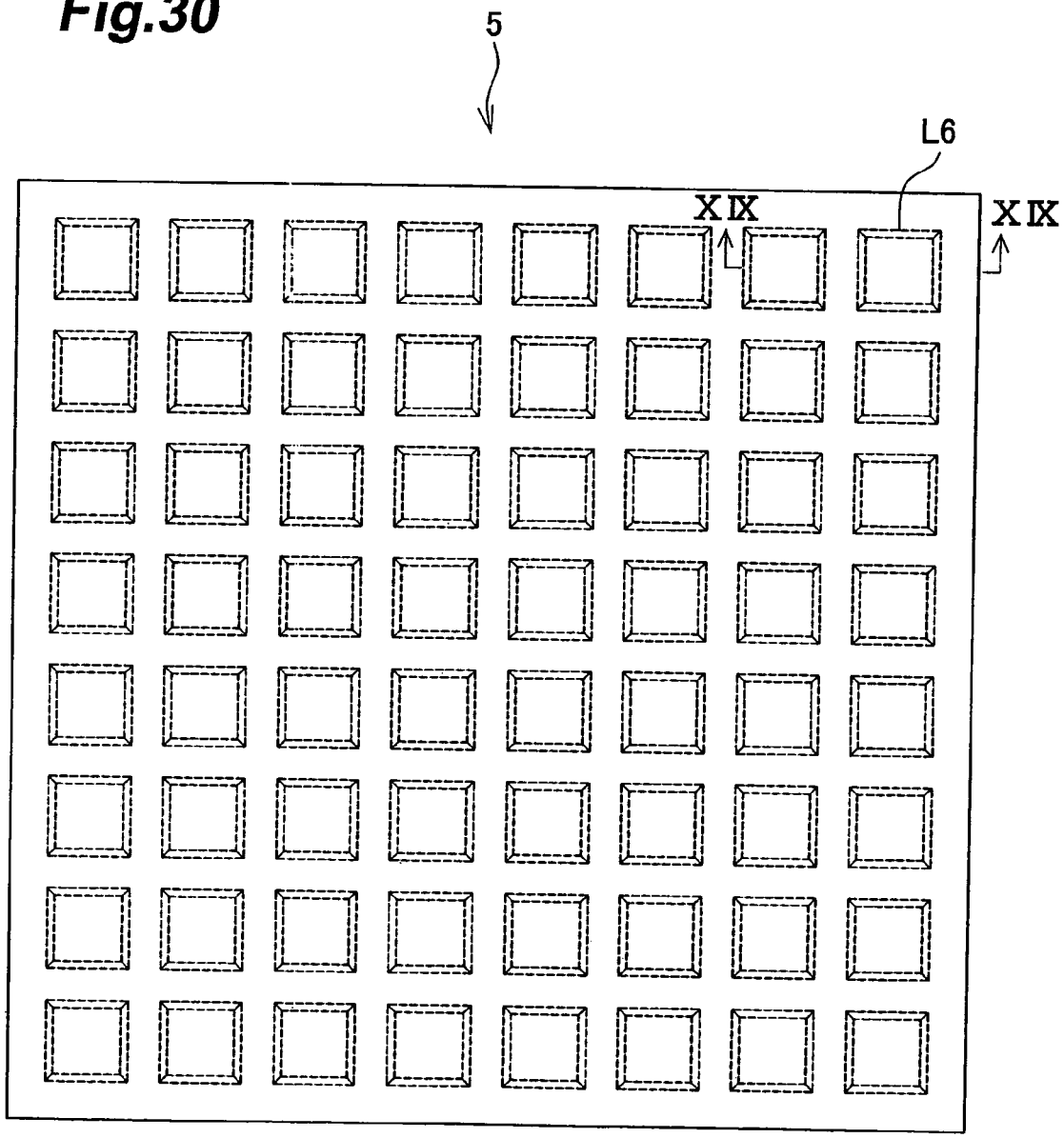
FIG. 30 is a cross-sectional view showing a fifth embodiment of a back illuminated photodetector according to the present invention.

FIG. 30 is a plan view showing a fifth embodiment of a back illuminated photodetector according to the present invention. The back illuminated photodiode array 5 is composed of a total of sixty-four back illuminated photodiodes that are arranged in an eight-by-eight grid pattern. The arrangement pitch of these photodiodes is 1 mm, for example. FIG. 30 shows the appearance of the back illuminated photodiode array 5 when viewed from the rear surface side. The rear surface of each photodiode is covered with a coating layer and a window plate, as is the case with the back illuminated photodiode 1 shown in FIG. 1. It is noted that in FIG. 30, the portions where recessed portions are formed are indicated by the dashed lines L6.

Figure 31:
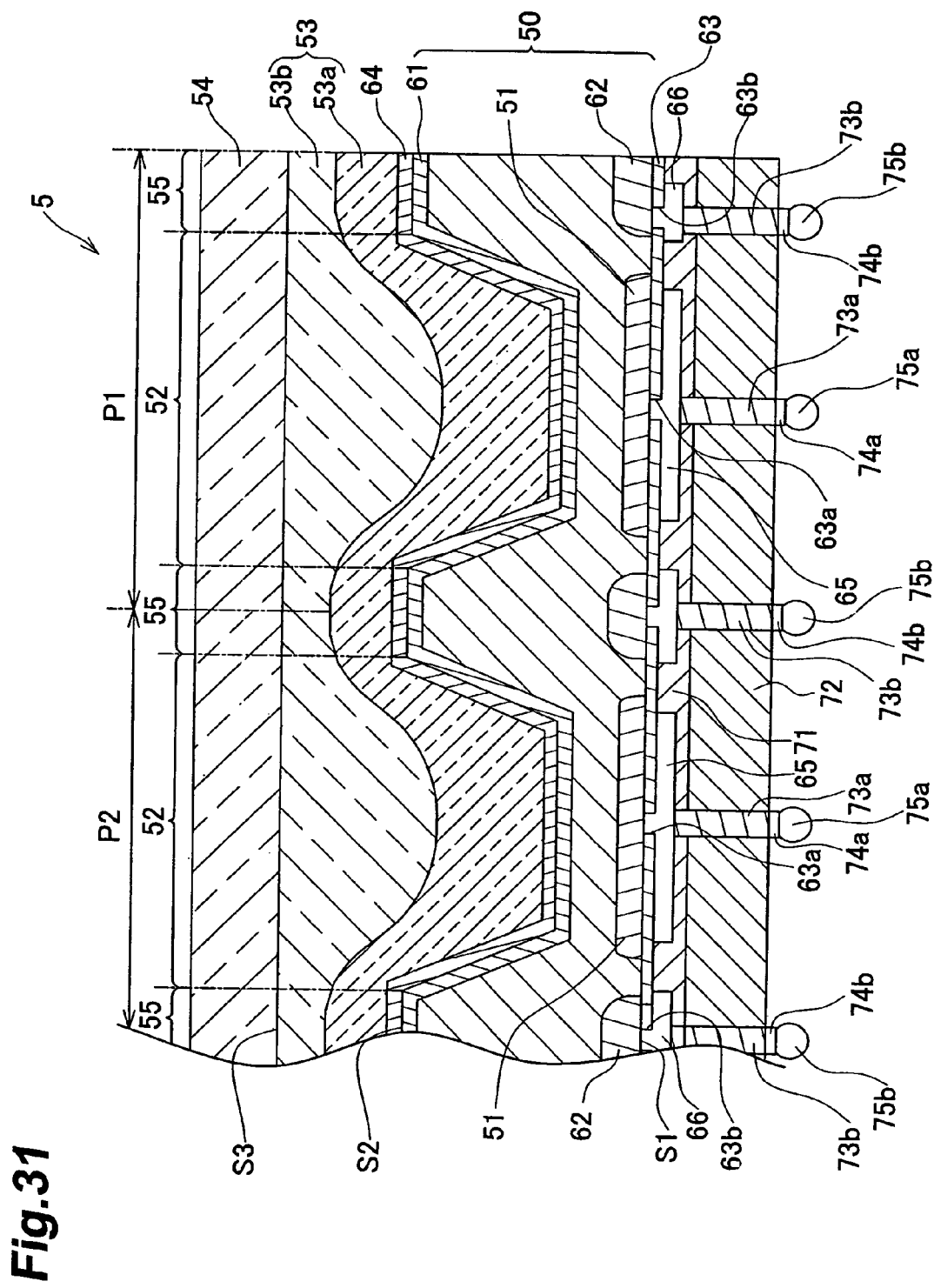
FIG. 31 is a cross-sectional view of the back illuminated photodiode array 5 shown in FIG. 30 along the line XIX-XIX.
Figure 32:
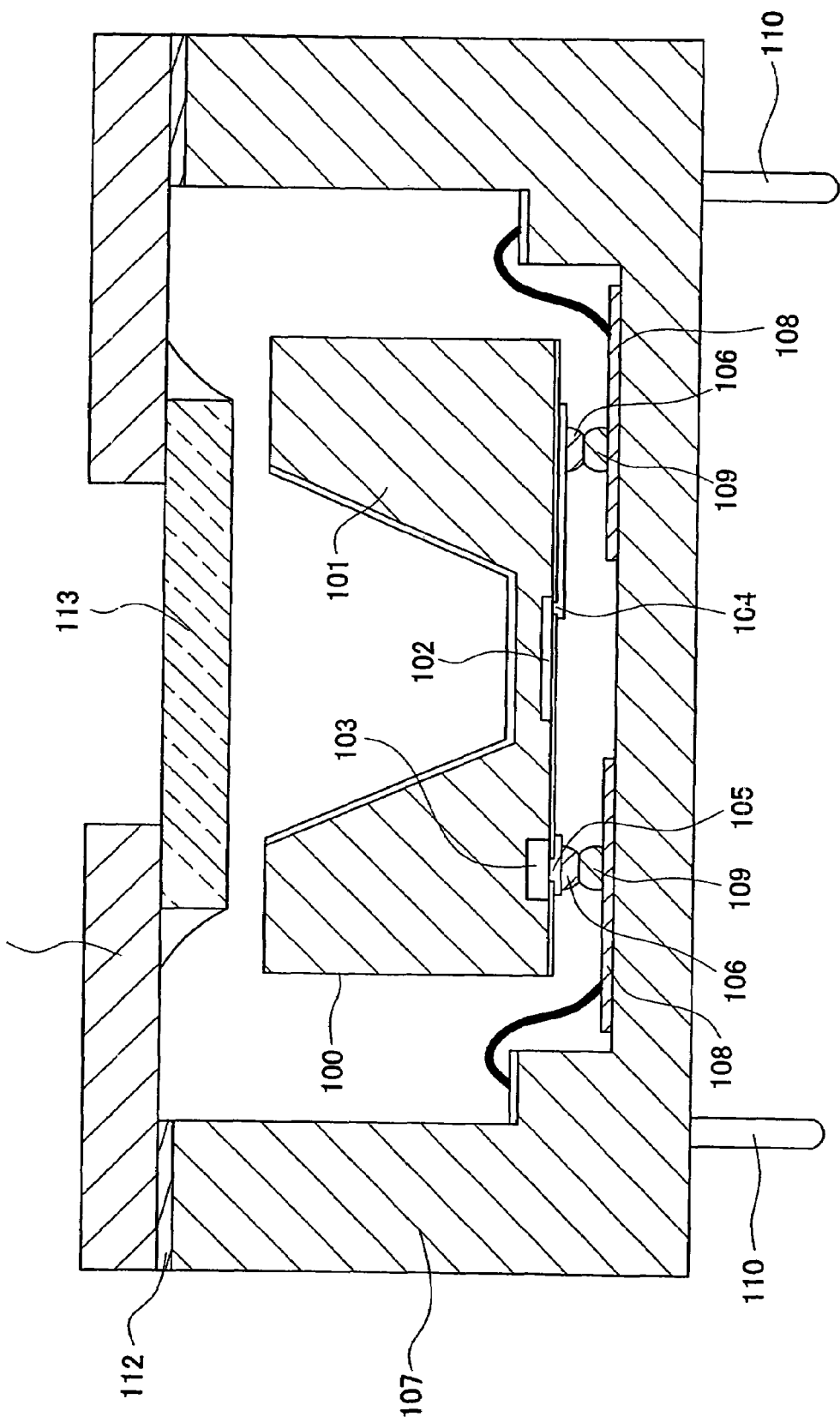
FIG. 32 is a cross-sectional view of a conventional back illuminated photodiode.

FIG. 31 is a cross-sectional view of the back illuminated photodiode array 5 shown in FIG. 30 along the line XIX-XIX. In the cross-sectional view are shown two photodiodes P1 and P2 among the sixty-four photodiodes shown in FIG. 30. As shown in FIG. 31, the back illuminated photodiode array 5 comprises an N-type semiconductor substrate 50, a $P^+$-type impurity semiconductor region 51, recessed portions 52, a coating layer 53, and a window plate 54.

In the surface layer on the upper surface S1 side of the N-type semiconductor substrate 50 are formed a plurality of $P^+$-type impurity semiconductor regions 51. The $P^+$-type impurity semiconductor regions 51 are provided, respectively, for the photodiodes P1 and P2. The area of each $P^+$-type impurity semiconductor region 51 is 0.75×0.75 $\mu mm^2$, for example. In the rear surface S2 of the N-type semiconductor substrate 50 and in an area opposite the $P^+$-type impurity semiconductor region 51 is formed the recessed portion 52. Here is formed a plurality of recessed portions 52 being provided with a plurality of $P^+$-type impurity semiconductor regions 51. In each of the photodiodes P1 and P2 are provided a pair of a P+-type impurity semiconductor region 51 and a recessed portion 52. On the rear surface S2 of the N-type semiconductor substrate 50 is also provided the coating layer 53.

The coating layer 53 consists of a resin layer 53a provided on the rear surface S2 and a resin layer 53b provided on the resin layer 53a. As the resin layers 53a and 53b, resin transparent to to-be-detected light is used. The resin layer 53a is arranged in such a manner that the portion provided on the recessed portion 52 is sunk lower than the portion provided on the outer edge portion 55 of the recessed portion 52. The resin layer 53b is brought into close contact with the resin layer 53a with no clearance, and therefore has a shape having a plurality of protrusions on the resin layer 53a side which corresponds to the recession of the resin layer 53a. Meanwhile, the surface S3 of the resin layer 53b has a substantially flat shape. On the surface S3 of the coating layer 53 is provided the window plate 54.

The back illuminated photodiode array 5 also comprises an N+-type highly-doped impurity semiconductor layer 61, N+-type highly-doped impurity semiconductor regions 62, insulating films 63 and 64, anode electrodes 65, and cathode electrodes 66. The N+-type highly-doped impurity semiconductor layer 61 is formed in the entire surface layer on the rear surface S2 side of the N-type semiconductor substrate 50. The N+-type highly-doped impurity semiconductor regions 62 are formed in the surface layer on the upper surface S1 side of the N-type semiconductor substrate 50. The N+-type highly-doped impurity semiconductor regions 62 are preferably provided in such a manner as to surround the P+-type impurity semiconductor regions 51 constituting the respective photodiodes.

On the upper surface S1 and the rear surface S2 of the N-type semiconductor substrate 50 are formed, respectively, the insulating films 63 and 64. In the insulating film 63 are formed openings 63a and 63b, some openings 63a being provided within the range of the P+-type impurity semiconductor regions 51, while the other openings 63b being provided within the range of the N+-type highly-doped impurity semiconductor regions 62.

On the insulating film 63 and in the areas including the openings 63a and 63b are formed, respectively, the anode electrodes 65 and the cathode electrodes 66. In each of the photodiodes P1 and P2 are provided a pair of an anode electrode 65 and a cathode electrode 66. The electrodes 65 and 66 are also provided in such a manner as to fill the respective openings 63a and 63b. Thus, the anode electrodes 65 are connected directly to the P+-type impurity semiconductor regions 51 via the respective openings 63a, while the cathode electrodes 66 are connected directly to the N+-type highly-doped impurity semiconductor regions 62 via the respective openings 63b.

The back illuminated photodiode array 5 further comprises a passivating film 71, a supporting film 72, filling electrodes 73a and 73b, UBMs 74a and 74b, and bumps 75a and 75b. The passivating film 71 is provided on the upper surface S1 of the N-type semiconductor substrate 50 in such a manner as to cover the insulating film 63, anode electrodes 65, and cathode electrodes 66. On the passivating film 71 is formed the supporting film 72. Also, the filling electrodes 73a and 73b penetrate through the passivating film 71 and the supporting film 72 to extend, respectively, from the anode electrodes 65 and the cathode electrodes 66 to the surface of the supporting film 72. On the exposed portions of the filling electrodes 73a and 73b at the surface of the supporting film 72 are formed the UBMs 74a and 74b. On the surfaces of the UBMs 74a and 74b on the opposite side of the filling electrodes 73a and 73b are formed the bumps 75a and 75b.

The effect of the back illuminated photodiode array 5 will here be described. In the back illuminated photodiode array 5, since there is provided the coating layer 53, the mechanical strength of the back illuminated photodiode array 5 is increased. Also, the increase in mechanical strength allows for dicing per whole wafer, whereby it is possible to obtain an exactly array-sized back illuminated photodiode array 5 with no extra area on the periphery thereof. Accordingly, there is achieved a back illuminated photodiode array 5 having a sufficiently small package.

Further, the window plate 54 is provided on the surface S3 of the coating layer 53. Therefore, the surface of the window plate 54 functions as an incident plane for to-be-detected light, whereby it is possible to suppress the scattering of to-be-detected light at the incident plane. In addition, since the interface between the window plate 54 and the coating layer 53, that is, the surface S3 of the coating layer 53 is to be flattened sufficiently, it is also possible to suppress the scattering of to-be-detected light at the surface S3 of the coating layer 53. Accordingly, it is possible to achieve a highly sensitive back illuminated photodiode array 5.

There is also constructed a plurality of photodiodes by forming a plurality of P+-type impurity semiconductor regions 51 in a plurality of areas in the surface layer on the upper surface S1 side of the N-type semiconductor substrate 50, and by forming a plurality of recessed portions 52 in the rear surface S2 and in areas opposite to the respective P+-type impurity semiconductor regions 51. Therefore, the back illuminated photodiode array 5 can suitably be used for an image sensor, etc., in which each photodiode represents one pixel.

The back illuminated photodetector according to the present invention is not restricted to the above-described embodiments, and various modifications may be made. For example, in the back illuminated photodiode 1 shown in FIG. 1, a P-type semiconductor substrate may be used instead of the N-type semiconductor substrate 10. In this case, the impurity semiconductor region 11 has N-type conductivity, while the highly-doped impurity semiconductor layer 21 and the highly-doped impurity semiconductor region 22 have P-type conductivity.

Although in FIG. 13 is shown an example of depositing a conductive material 33 made of Cu, Ni may be used instead of Cu to perform electroless plating of Ni directly on the surface of the anode electrodes 25 and the cathode electrodes 26 that are exposed from the openings 31a and 32a. In this case, it is possible to omit the step of polishing the surface of the conductive material 33 illustrated in FIG. 14.

Although in FIG. 18 an example of forming UBMs 34a and 34b as well as bumps 35a and 35b on the filling electrodes 33a and 33b is shown, there is also a method of employing the filling electrodes 33a and 33b themselves as bumps. That is, $O_2$, etc., is used to dry etch the surface of the supporting film 32 with the openings 32a being filled with the filling electrodes 33a and 33b (refer to FIG. 17). Thus, since the filling electrodes 33a and 33b partially protrude from the surface of the supporting film 32, the protruding portions can be used as bumps. In this case, it is also not necessary to form UBMs 34a and 34b. Alternatively, as a conductive material for forming the filling electrodes 33a and 33b, a conductive resin may be used. This allows the operation of filling the through holes with electrodes by printing, etc., to be completed in a short time.

Although in FIG. 21 an arrangement that chamfered portions 14a are formed at the four corners of the window plate 14 is shown, it is only required that at least one corner of the window plate 14 is formed into a chamfered portion 14a. Also, in this case, it is possible to reduce the possibility of chipping relative to the case where no chamfered portion 14a is provided.

Also, in FIG. 26, as the N-type semiconductor substrate 20, a bonded wafer in which an N$^+$-type highly-doped impurity semiconductor layer and an N-type impurity semiconductor layer having an impurity concentration lower than that of the N$^+$-type highly-doped impurity semiconductor layer are bonded to each other may be used. In this case, the N-type impurity semiconductor layer is to be provided on the upper surface S1 side, while the N$^+$-type highly-doped impurity semiconductor layer on the rear surface S2 side of the N-type semiconductor substrate 20.

INDUSTRIAL APPLICABILITY

In accordance with the present invention, it is possible to achieve a back illuminated photodetector having a sufficiently small package as well as being capable of suppressing the scattering of to-be-detected light and method for manufacturing the same.

The invention claimed is:

1. A back illuminated photodetector comprising:
a first conductive type semiconductor substrate;
a second conductive type impurity semiconductor region provided in a first superficial surface layer of said semiconductor substrate;
a recessed portion for incidence of to-be-detected light formed in a second surface of said semiconductor substrate and in an area opposite said impurity semiconductor region;
a coating layer made of resin for transmitting said to-be-detected light to said recessed portion and having a substantially flat surface, said coating layer being provided on the second surface; and
a window plate provided on said substantially flat surface of said coating layer to transmit said to-be-detected light to said coating layer,
wherein said coating layer consists of a first resin layer provided on the second surface and a second resin layer provided on said first resin layer and having said substantially flat surface on the opposite side of said first resin layer,
wherein said first resin layer is arranged in such a manner that a portion of the first resin layer provided on said recessed portion in the second surface is sunk lower than a portion of the first resin layer provided on an outer edge portion of said recessed portion,
wherein said window plate has a square cross-sectional shape with at least one corner being chamfered in a plane perpendicular to the thickness direction thereof, and
wherein the surface of the coating layer is exposed from a chamfered portion.

2. The back illuminated photodetector according to claim 1, further comprising a supporting film provided on the first surface of said semiconductor substrate to support said semiconductor substrate.

3. The back illuminated photodetector according to claim 2, further comprising a filling electrode penetrating through the supporting film and connected electrically to the impurity semiconductor region at one end thereof.

4. The back illuminated photodetector according to claim 1, wherein a highly-doped impurity semiconductor region with impurities of said first conductive type added thereto at a high concentration is exposed across the entire side surface of said semiconductor substrate.

5. The back illuminated photodetector according to claim 1, wherein a highly-doped impurity semiconductor layer with impurities of the first conductive type added thereto at a high concentration is provided in a bottom portion of the recessed portion within the second superficial surface layer of the semiconductor substrate.

6. The back illuminated photodetector according to claim 1, wherein a highly-doped impurity semiconductor layer with impurities of said first conductive type added thereto at a high concentration is provided in a second superficial surface layer in an outer edge portion of said semiconductor substrate.

7. The back illuminated photodetector according to claim 1, wherein a highly-doped impurity semiconductor layer with impurities of the first conductive type added thereto at a high concentration is provided in the second superficial surface layer from the bottom portion of the recessed portion to the outer edge portion of said semiconductor substrate continuously.

* * * * *